(12) United States Patent
Reznicek et al.

(10) Patent No.: US 11,894,433 B2
(45) Date of Patent: Feb. 6, 2024

(54) METHOD AND STRUCTURE TO IMPROVE STACKED FET BOTTOM EPI CONTACT

(71) Applicant: INTERNATIONAL BUSINESS MACHINES CORPORATION, Armonk, NY (US)

(72) Inventors: Alexander Reznicek, Troy, NY (US); Ruilong Xie, Niskayuna, NY (US); Chen Zhang, Guilderland, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 17/304,461

(22) Filed: Jun. 22, 2021

(65) Prior Publication Data

US 2022/0406908 A1  Dec. 22, 2022

(51) Int. Cl.
*H01L 29/417* (2006.01)
*H01L 29/423* (2006.01)
*H01L 29/06* (2006.01)
*H01L 29/40* (2006.01)

(52) U.S. Cl.
CPC .... *H01L 29/41733* (2013.01); *H01L 29/0665* (2013.01); *H01L 29/401* (2013.01); *H01L 29/42392* (2013.01)

(58) Field of Classification Search
CPC ........... H01L 29/41733; H01L 29/0665; H01L 29/401; H01L 29/42392; H01L 29/0673; H01L 21/8221; H01L 21/823418; H01L 21/823475; H01L 21/823481; H01L 27/0688; H01L 27/088; H01L 29/41725; H01L 29/66439; H01L 29/66545; H01L 29/775; H01L 29/78696; B82Y 10/00
See application file for complete search history.

(56) References Cited

U.S. PATENT DOCUMENTS

| | | | |
|---|---|---|---|
| 7,683,428 B2 | 3/2010 | Chidambarrao | |
| 9,659,963 B2 | 5/2017 | Cheng | |
| 9,773,913 B1 * | 9/2017 | Balakrishnan | .... H01L 21/28518 |
| 9,837,414 B1 | 12/2017 | Balakrishnan | |
| 10,103,247 B1 | 10/2018 | Ruilong | |
| 10,192,819 B1 | 1/2019 | Chanemougame | |

(Continued)

FOREIGN PATENT DOCUMENTS

| | | |
|---|---|---|
| CN | 102376664 B | 5/2015 |
| EP | 0562207 B1 | 6/1996 |
| WO | 2016057973 A1 | 4/2016 |

OTHER PUBLICATIONS

Ryckaert et al., "Enabling Sub-5nm CMOS Technology Scaling Thinner and Taller!", International Electron Devices Meeting (IEDM), © 2019 IEEE, pp. 29.4.1-29.4.4.

*Primary Examiner* — Shahed Ahmed
*Assistant Examiner* — Khatib A Rahman
(74) *Attorney, Agent, or Firm* — Samuel A. Waldbaum

(57) ABSTRACT

A stacked semiconductor device comprising a lower source/drain epi located on top of a bottom dielectric layer. An isolation layer located on top of the lower source/drain epi and an upper source/drain epi located on top of the isolation layer. A lower electrical contact that is connected to the lower source/drain epi, wherein the lower electrical contact is in direct contact with multiple side surfaces of the lower source/drain epi.

16 Claims, 24 Drawing Sheets

(56) References Cited

U.S. PATENT DOCUMENTS

| | | | |
|---|---|---|---|
| 10,192,867 B1* | 1/2019 | Frougier | H01L 21/823828 |
| 2004/0188797 A1* | 9/2004 | Khater | H01L 29/66242 |
| | | | 257/E29.183 |
| 2021/0242330 A1* | 8/2021 | Jun | H01L 21/28512 |
| 2022/0037494 A1* | 2/2022 | Park | H01L 29/66439 |
| 2022/0293760 A1* | 9/2022 | Hung | H01L 29/42392 |

* cited by examiner

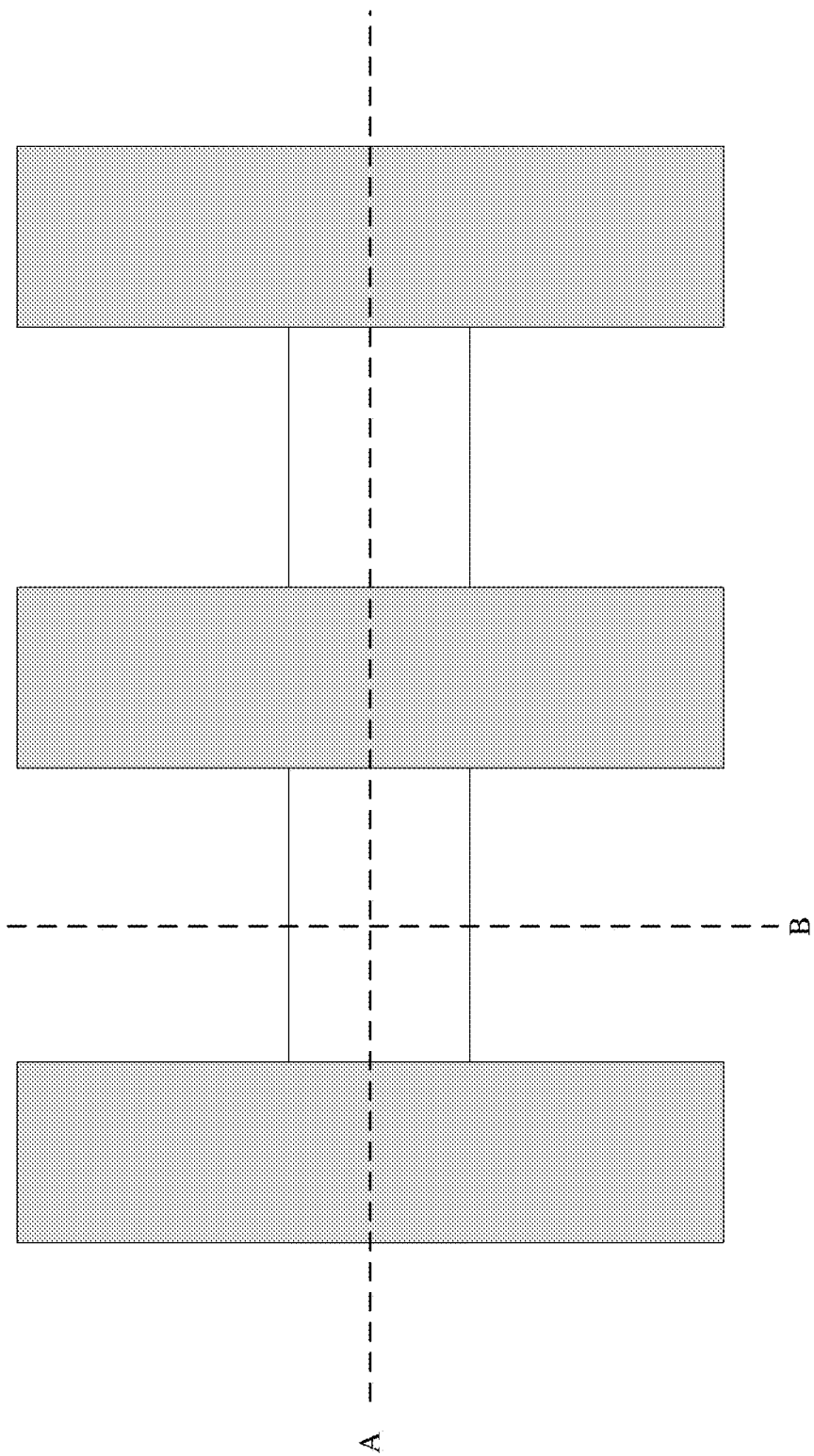

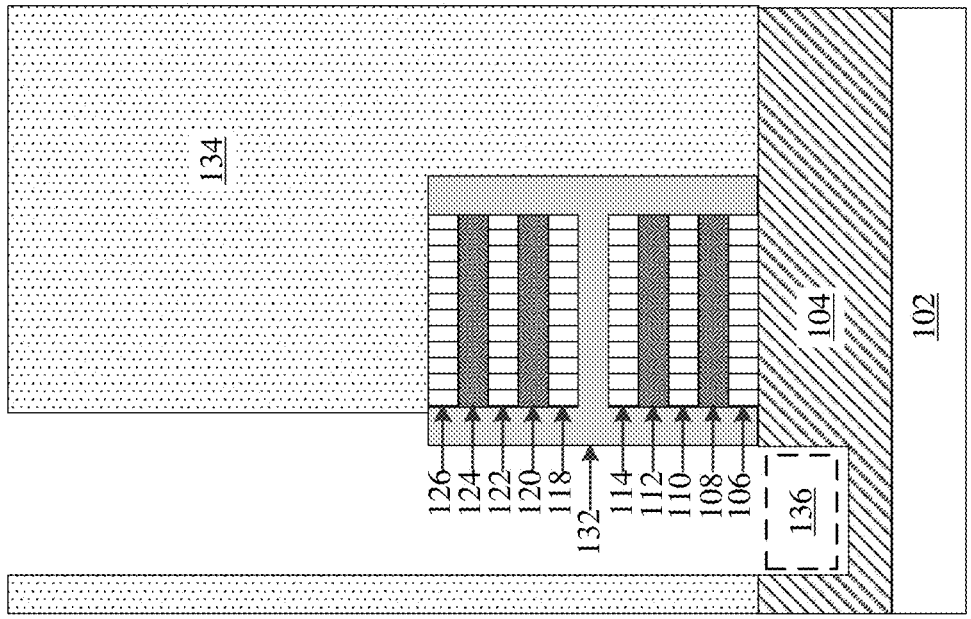
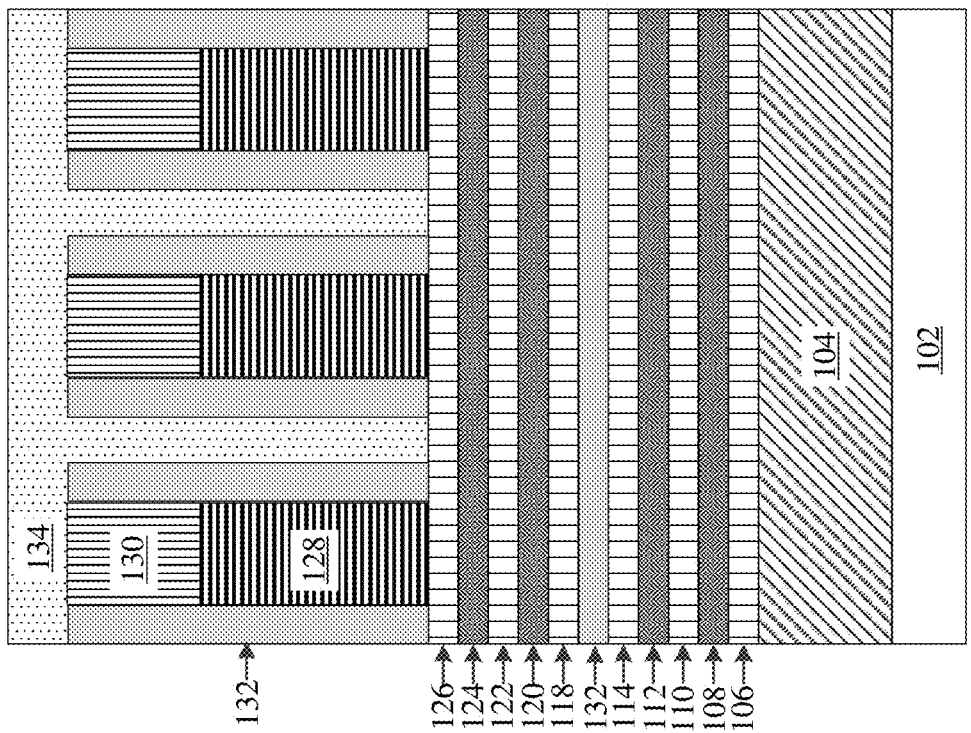
FIG. 6A
FIG. 6B

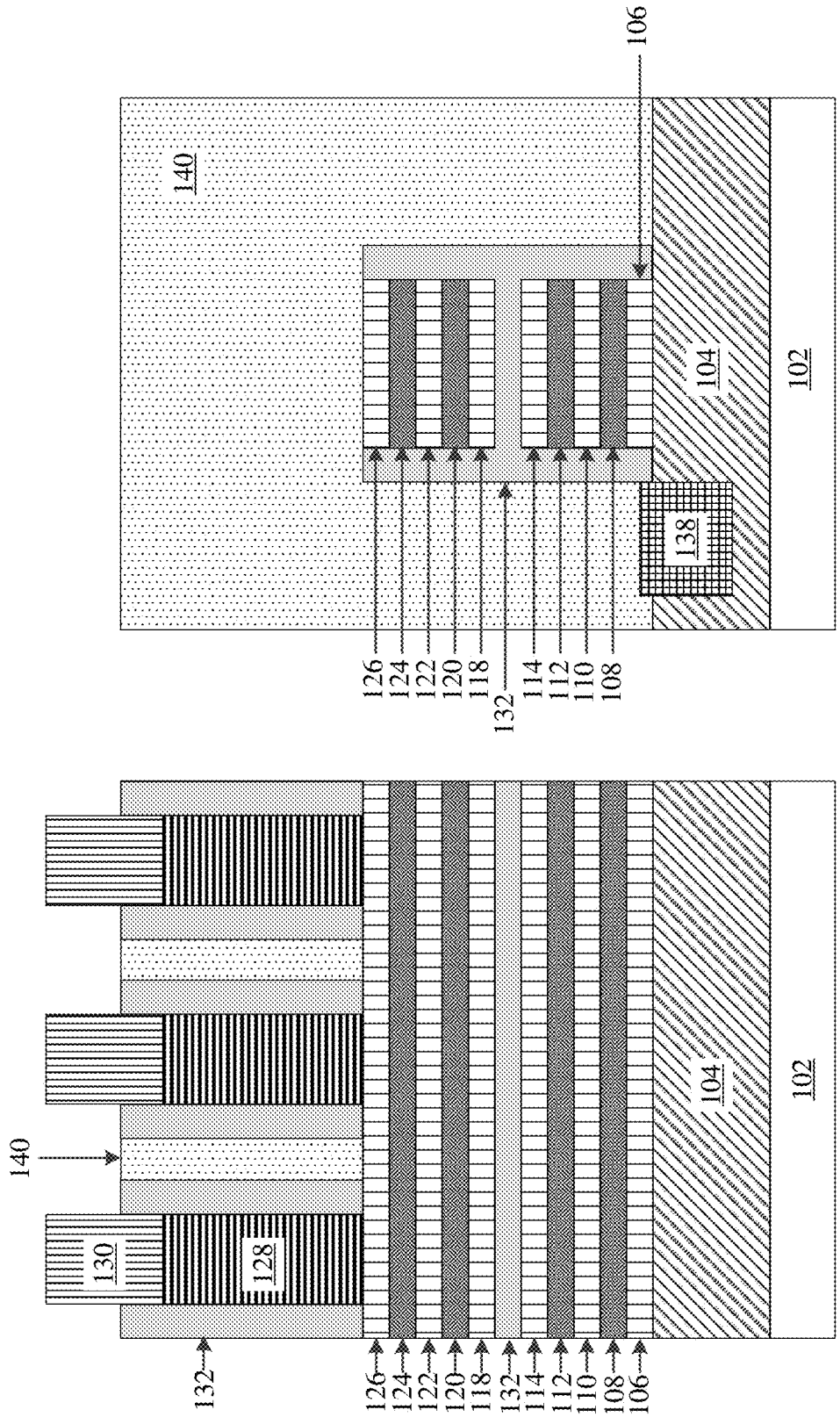

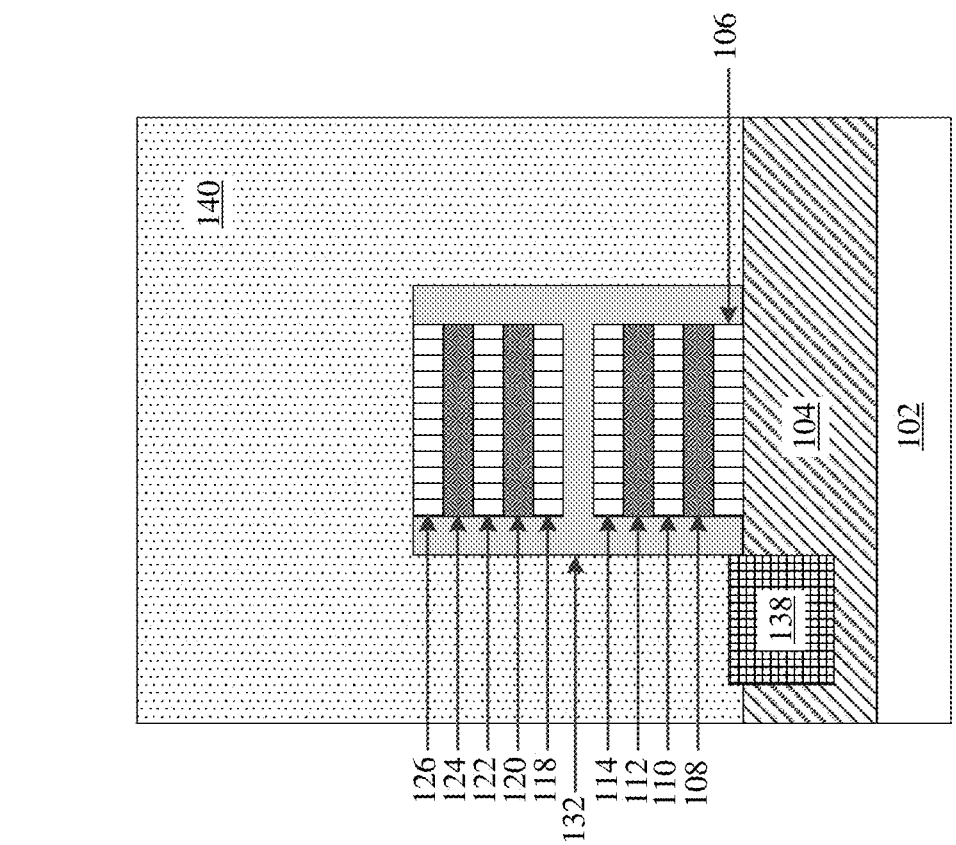
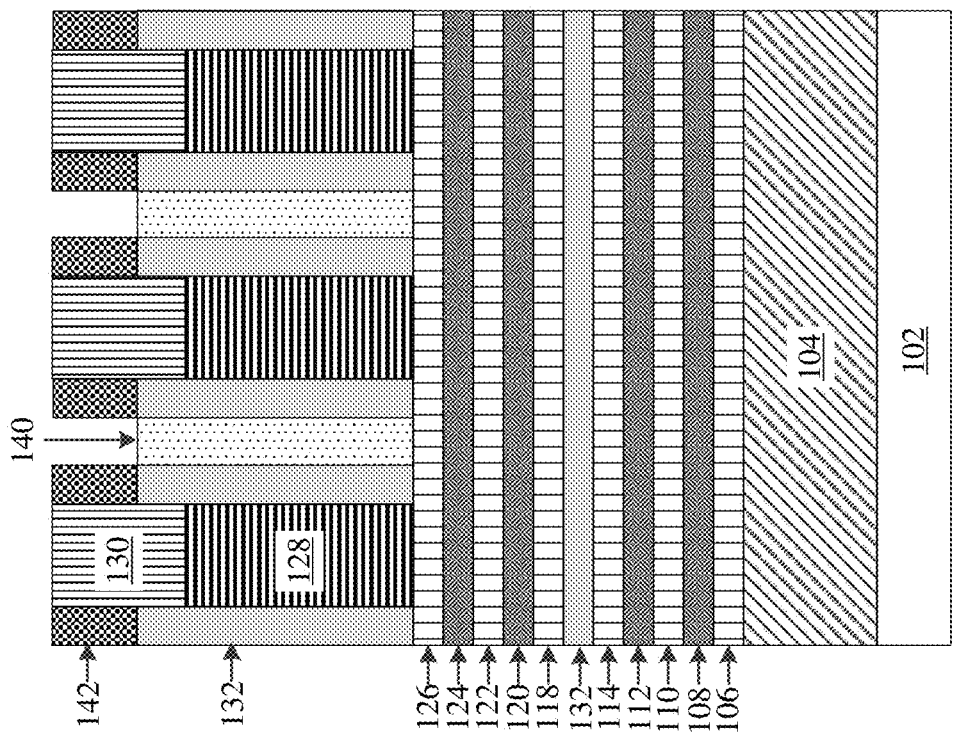
FIG. 10A
FIG. 10B

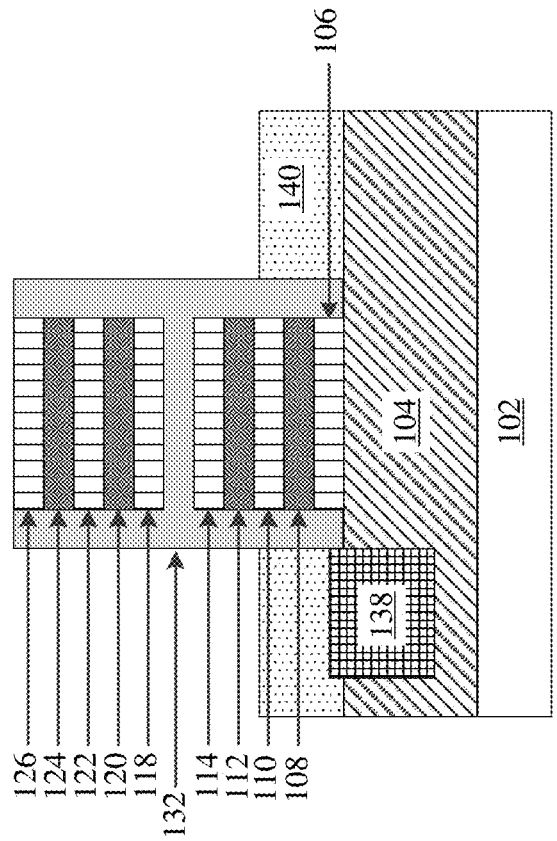
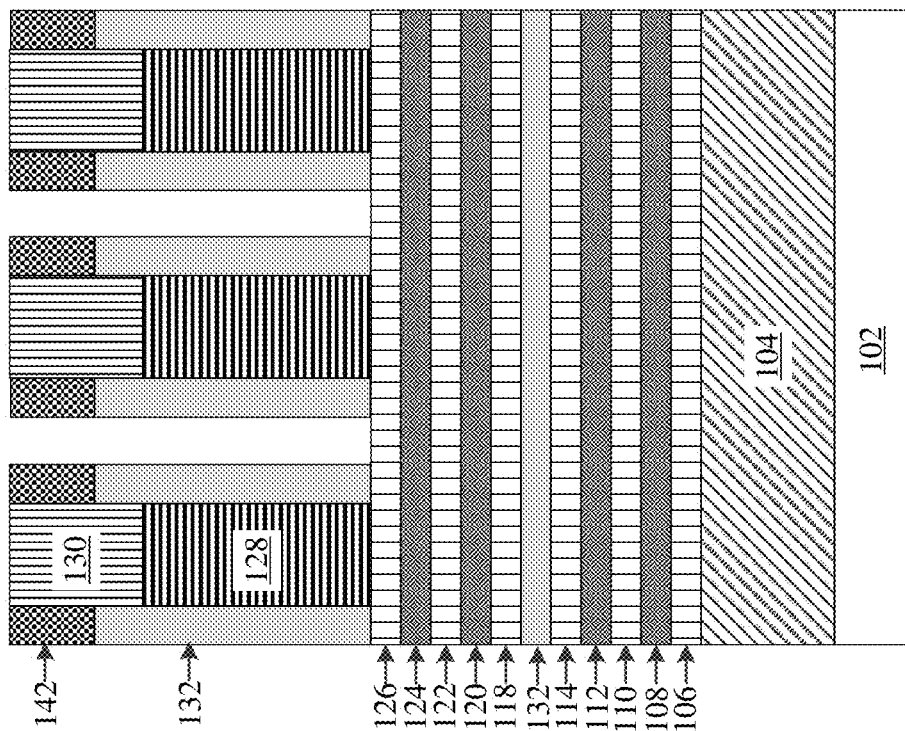
FIG. 11B
FIG. 11A

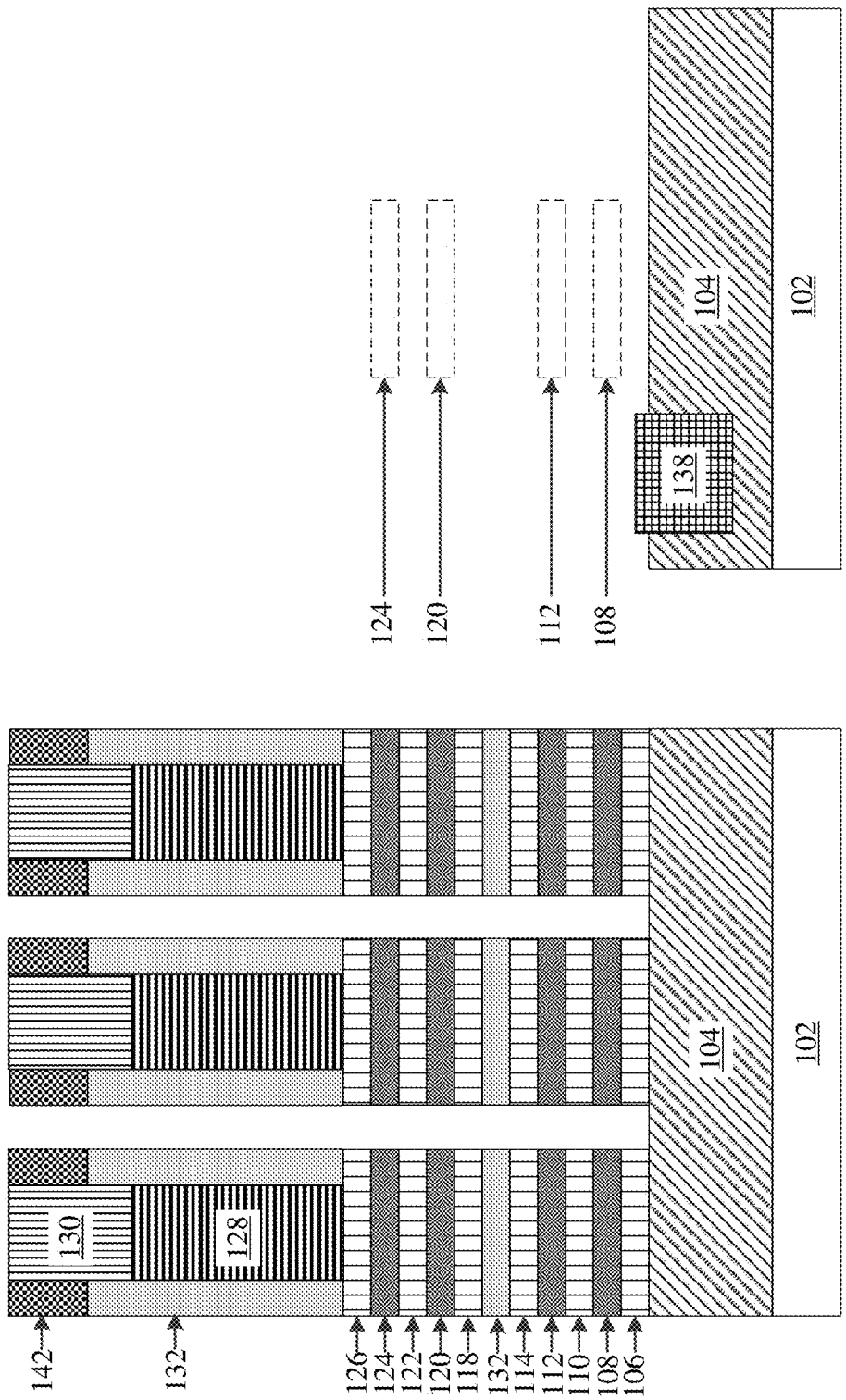

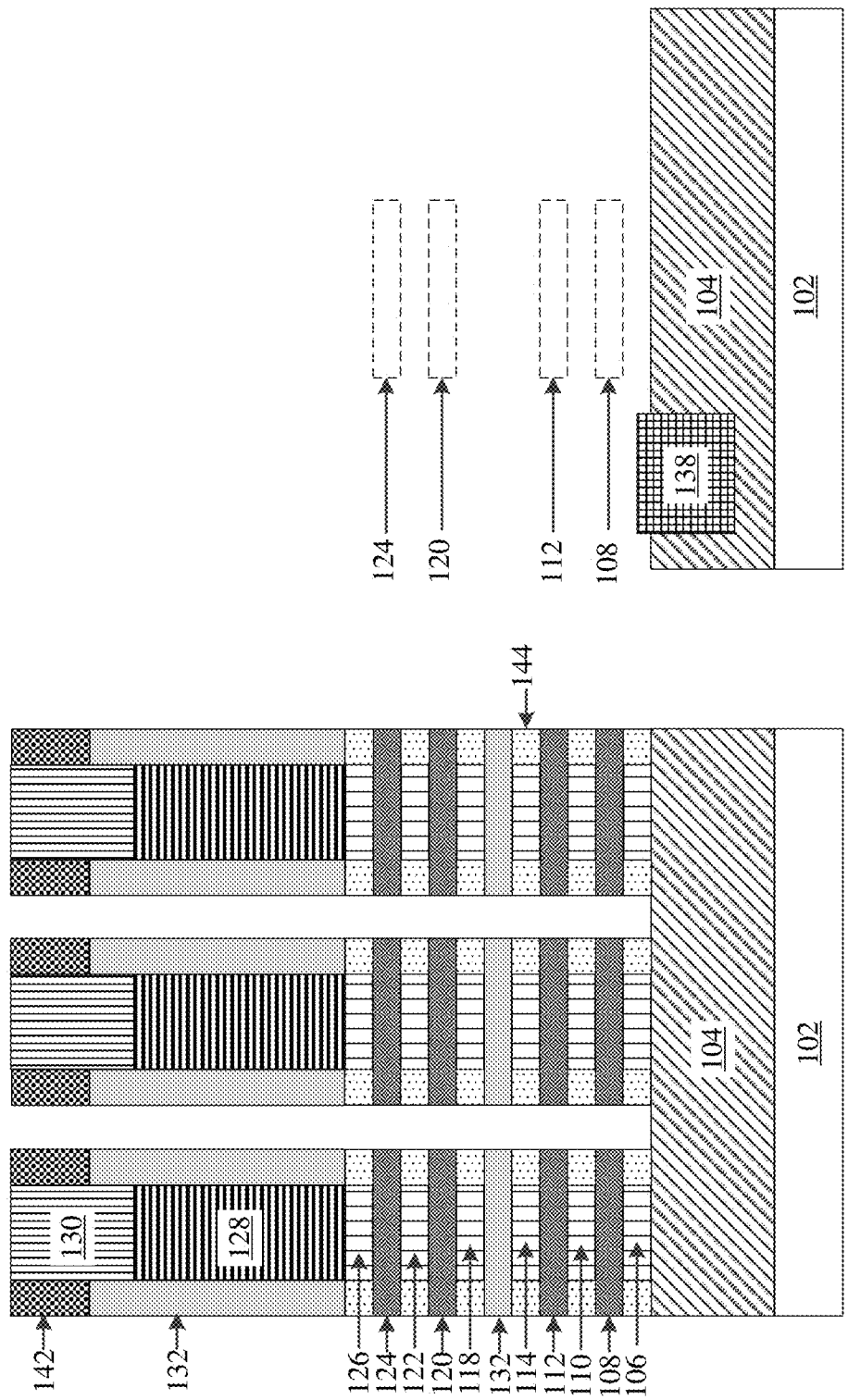

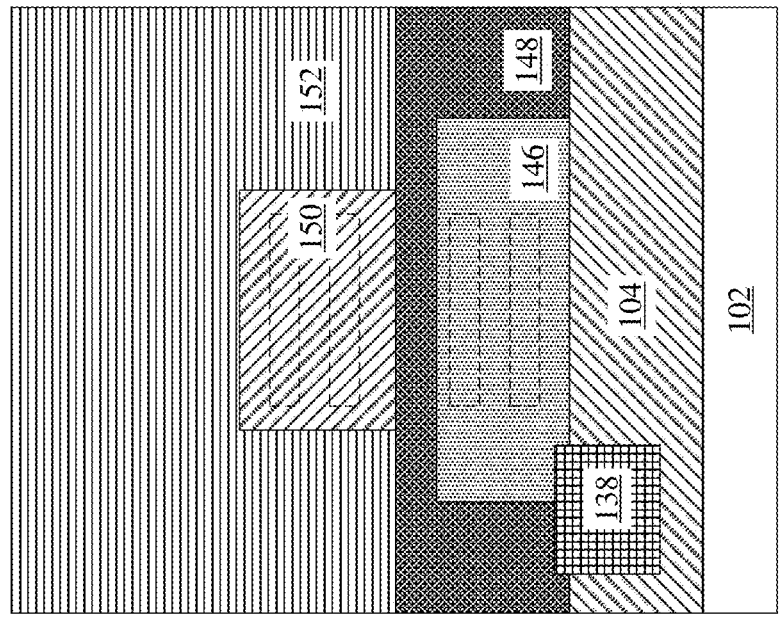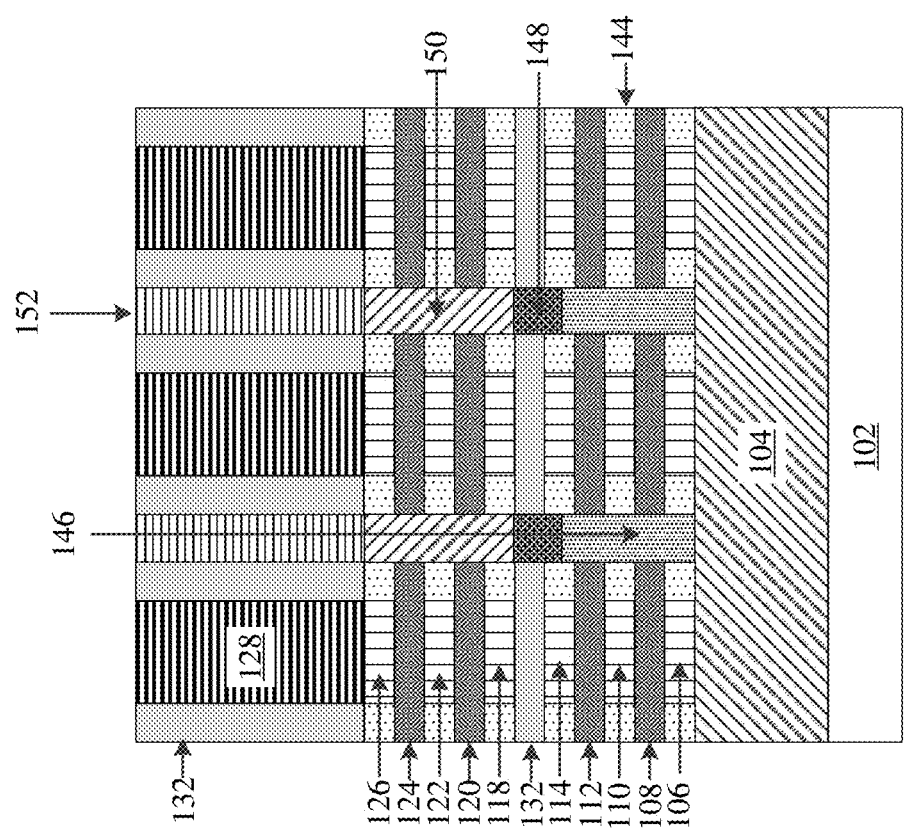
FIG. 19A
FIG. 19B

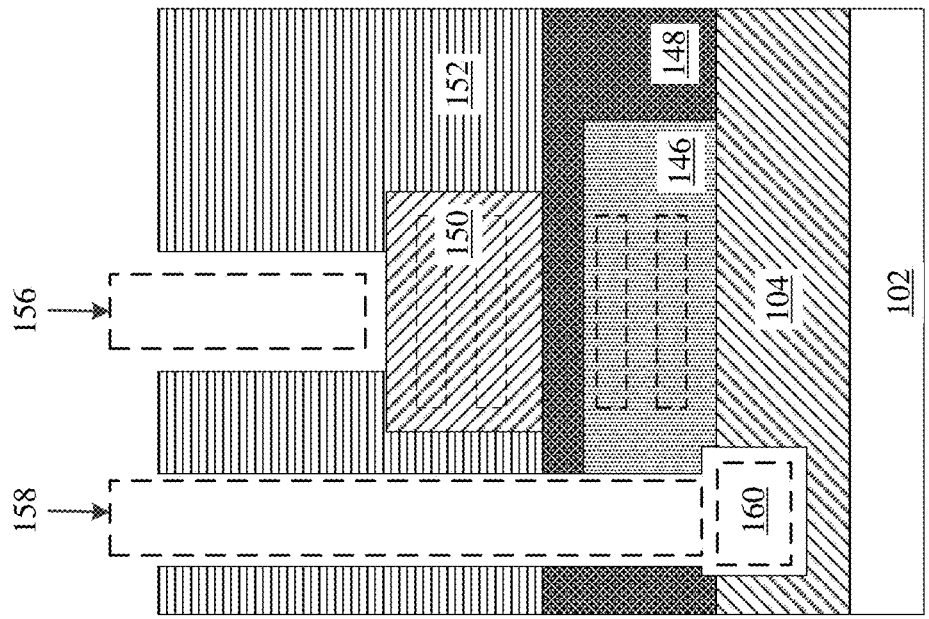
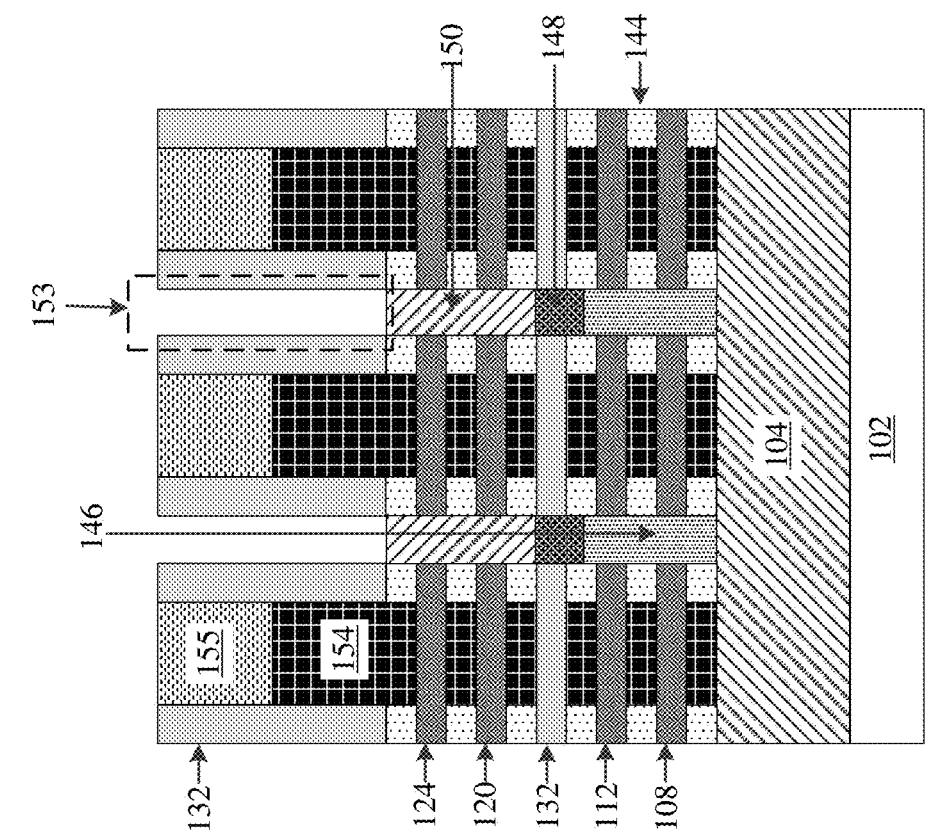
FIG. 22B
FIG. 22A

METHOD AND STRUCTURE TO IMPROVE
STACKED FET BOTTOM EPI CONTACT

BACKGROUND

The present invention generally relates to the field of stacked devices, and more particularly to increasing the contact surface area between an electrical contact and the lower device.

As traditional scaling comes to its limitations, future technology requires other ideas to increase device density on chips. One way to increase device density is to stack transistors on top of each other. The issue with stacking transistors is having a sufficient surface contact between the lower transistor and an electrical contact without increasing the require space of the stacked devices.

BRIEF SUMMARY

Additional aspects and/or advantages will be set forth in part in the description which follows and, in part, will be apparent from the description, or may be learned by practice of the invention.

A stacked semiconductor device comprising a lower source/drain epi located on top of a bottom dielectric layer. An isolation layer located on top of the lower source/drain epi and an upper source/drain epi located on top of the isolation layer. A lower electrical contact that is connected to the lower source/drain epi, wherein the lower electrical contact is in direct contact with multiple side surfaces of the lower source/drain epi.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 1 illustrates a top-down view of a stacked devices, in accordance with an embodiment of the present invention.

FIG. 6A illustrates cross section A of the stacked devices after formation of a lithography layer, in accordance with the embodiment of the present invention.

FIG. 6B illustrates cross section B of the stacked devices after formation of a cavity in the dielectric layer, in accordance with the embodiment of the present invention.

FIG. 9A illustrates cross section A of the stacked devices after formation of a second lithography layer, in accordance with the embodiment of the present invention.

FIG. 9B illustrates cross section B of the stacked devices after formation of the second lithography layer, in accordance with the embodiment of the present invention.

FIG. 10A illustrates cross section A of the stacked devices after formation of a spacer cap, in accordance with the embodiment of the present invention.

FIG. 10B illustrates cross section B of the stacked devices after formation of the spacer cap, in accordance with the embodiment of the present invention.

FIG. 11A illustrates cross section A of the stacked devices after recessing the second lithography layer, in accordance with the embodiment of the present invention.

FIG. 11B illustrates cross section B of the stacked devices after recessing the second lithography layer, in accordance with the embodiment of the present invention.

FIG. 13A illustrates cross section A of the stacked devices after etching nanosheet stack, in accordance with the embodiment of the present invention.

FIG. 13B illustrates cross section B of the stacked devices after etching the nanosheet stack, in accordance with the embodiment of the present invention.

FIG. 14A illustrates cross section A of the stacked devices after formation of the inner spacer, in accordance with the embodiment of the present invention.

FIG. 14B illustrates cross section B of the stacked devices after formation of the inner spacer, in accordance with the embodiment of the present invention.

FIG. 19A illustrates cross section A of the stacked devices after formation of an interlayer dielectric layer, in accordance with the embodiment of the present invention.

FIG. 19B illustrates cross section B of the stacked devices after formation of the interlayer dielectric layer, in accordance with the embodiment of the present invention.

FIG. 22A illustrates cross section A of the stacked devices after removal of the eighth sacrificial layer, in accordance with the embodiment of the present invention.

FIG. 22B illustrates cross section B of the stacked devices after removal of the eighth sacrificial layer, in accordance with the embodiment of the present invention.

DETAILED DESCRIPTION

Figure 2B:
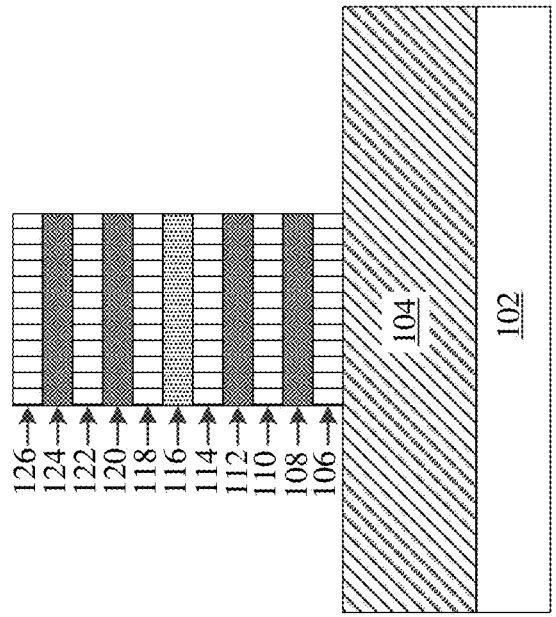
FIG. 2B illustrates cross section B of the stacked devices after the formation of the nanosheet stack, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," "an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. The present trend in microchips is to form smaller and smaller devices, and one way to reduce the size is by stacking devices, or transistors one on top of another. Electrical contacts need to be passed through the stack devices to connect to the lower device or transistor. Enlarging the lower device allows for an increase in the contact surface area between the lower device and the electrical contact. The problem with this solution is that it increases the footprint size of devices. The present invention is directed to increasing the contact surface area between the electrical contact and the lower device, or transistor, without increasing the footprint size of the devices. The increased contact surface area is achieved by undercutting the lower device and having the electrical contact wrap around the lower device. The electrical contact material fills the undercut, so the electrical contact is in direct contact with multiple sides of the devices.

FIG. 1 illustrates a top-down view of a stacked devices 100, in accordance with an embodiment of the present invention. FIG. 1 illustrates the top-down view of the layout of the gate and the active region for the stacked FET comprising nanosheet device for both top and bottom devices. The present invention uses nanosheet device as an example for top and bottom devices, but the application is not limited to nanosheet transistor but can be applied to any type of transistors. The present invention can be applied to any type of stacked device where space is limited for the stacked devices, such as FINFET over FINFET, FINFET over nanosheet, nanowire over nanowire, nanowire over FIN, etc. Cross section A and cross section B as illustrated in FIG. 1 correspond to each the proceeding figures having the same letter.

Figure 2A:
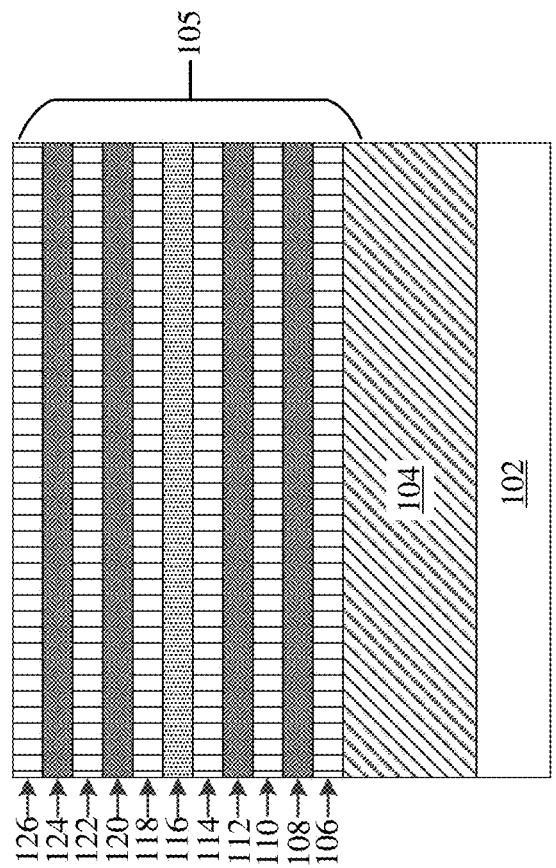
FIG. 2A illustrates cross section A of the stacked devices after the formation of the nanosheet stack, in accordance with the embodiment of the present invention.

FIG. 2A illustrates cross section A of the stacked devices 100 after the formation of the nanosheet stack 105, in accordance with the embodiment of the present invention. FIG. 2B illustrates cross section B of the stacked devices 100 after the formation of the nanosheet stack 105, in accordance with the embodiment of the present invention. The stacked device 100 includes a substrate 102, a dielectric layer 104 (such as BOX layer for SOI substrate, which comprises oxide), and a nanosheet stack 105. The nanosheet stack 105 includes a first sacrificial layer 106, a first layer 108, a second sacrificial layer 110, a second layer 112, a third sacrificial layer 114, a fourth sacrificial layer 116, a fifth sacrificial layer 118, a third layer 120, a sixth sacrificial layer 122, a fourth layer 124, and a seventh sacrificial layer 126. The number of layers described herein that comprise the nanosheet stack 105 is meant for exemplary purposes only. The number of layers illustrated is not meant to be limiting and the nanosheet stack 105 can be comprised of fewer or more layers.

The substrate 102 can be, for example, a material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate 102. In some embodiments, the substrate 102 includes both semiconductor materials and dielectric materials. The semiconductor substrate 102 may also comprise an organic semiconductor or a layered semiconductor such as, for example, Si/SiGe, a silicon-on-insulator or a SiGe-on-insulator. A portion or entire semiconductor substrate 102 be amorphous, polycrystalline, or monocrystalline. The semiconductor substrate 102 may be doped, undoped or contain doped regions and undoped regions therein. In some embodiments, the substrate 102 includes other device structures (not shown) such as transistors, isolation structures (such as shallow trench isolations), contacts, conducting wires, etc., or any suitable layer that can act as the base for the stacked device 100.

The first sacrificial layer 106, the second sacrificial layer 110, the third sacrificial layer 114, the fifth sacrificial layer 118, the sixth sacrificial layer 122, and the seventh sacrificial layer 126 can be comprised of, for example, SiGex, where the Ge % is in the range of about 5 to 30%. The fourth sacrificial layer 116 can be comprised of, for example, SiGex where Ge % is greater than or equal to 50%. The first layer 108, the second layer 112, the third layer 120, and the fourth layer 124 can be comprised of, for example, Si.

Figure 3B:
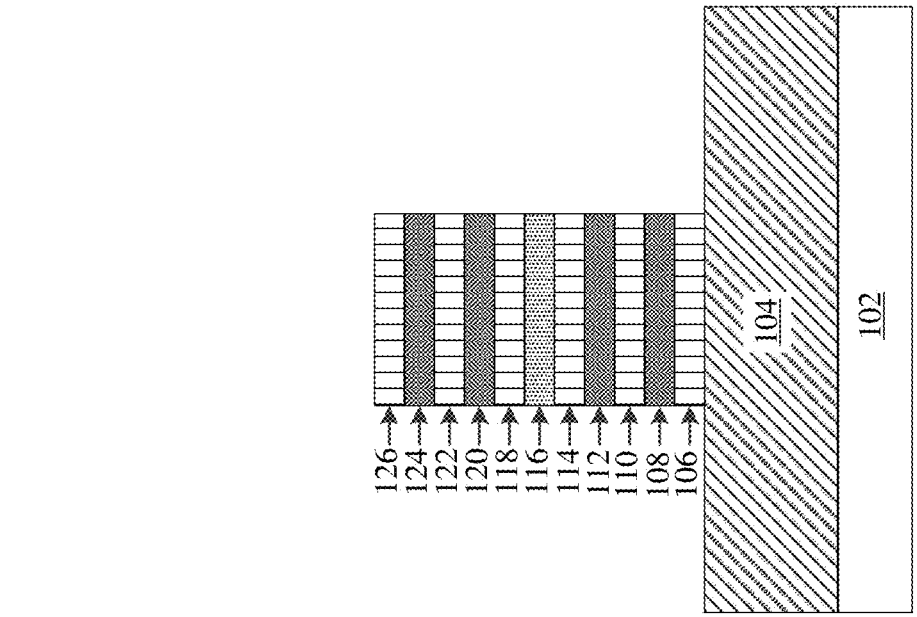
FIG. 3B illustrates cross section B of the stacked devices after the formation of the dummy gate, in accordance with the embodiment of the present invention.
Figure 3A:
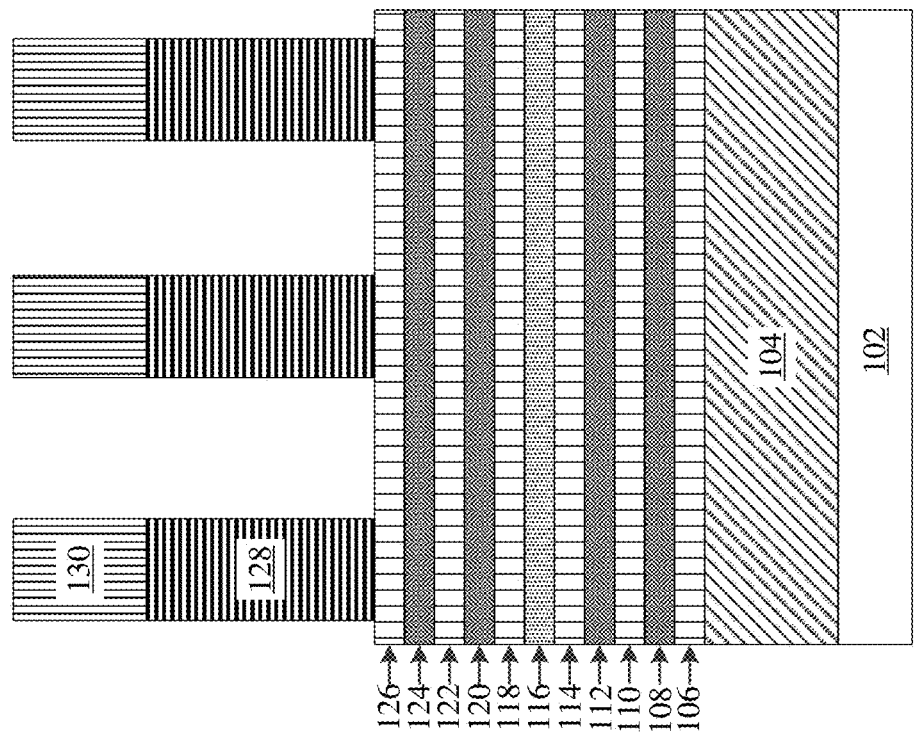
FIG. 3A illustrates cross section A of the stacked devices after formation of a dummy gate, in accordance with the embodiment of the present invention.

FIG. 3A illustrates cross section A of the stacked devices 100 after the formation of a dummy gate 128, in accordance with the embodiment of the present invention. FIG. 3B illustrates cross section B of the stacked devices 100 after the formation of the dummy gate 128, in accordance with the embodiment of the present invention. A dummy gate 128 is formed over the nanosheet stack 105. A hard mask 130 is formed on top of the dummy gate 128. The dummy gate 128 and the hard mask 130 are patterned to form columns composed of these layers. The dummy gate 128 is usually comprised of a thin $SiO_2$ liner followed by bulk material such as amorphous Si.

Figure 4B:
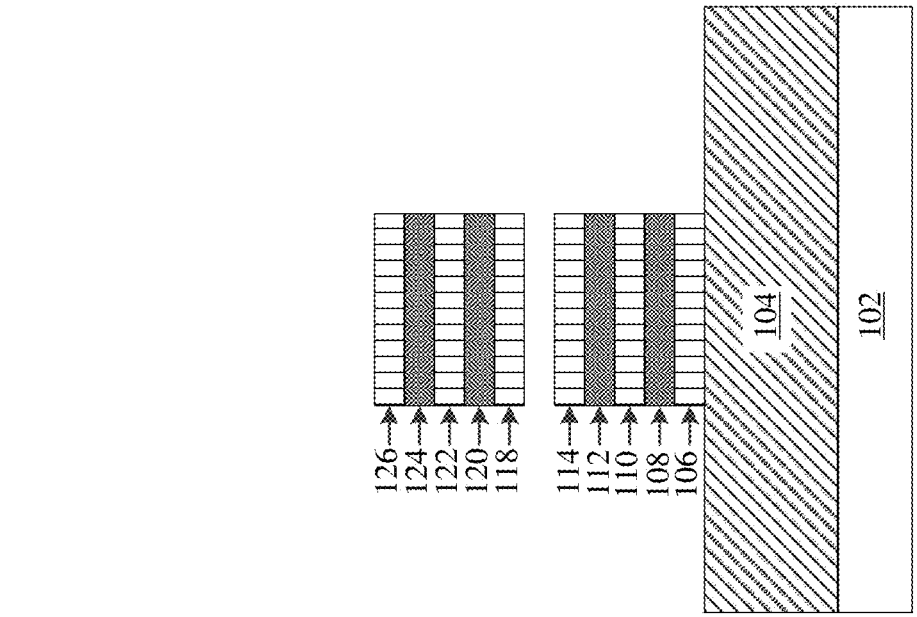
FIG. 4B illustrates cross section B of the stacked devices after the selective removal of the fourth sacrificial layer, in accordance with the embodiment of the present invention.
Figure 4A:
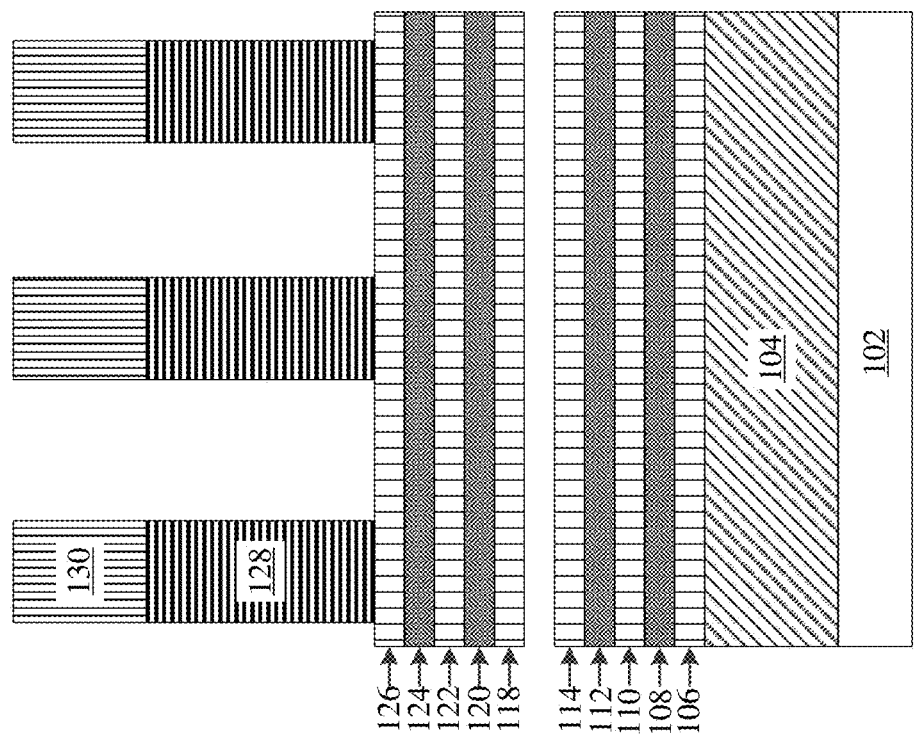
FIG. 4A illustrates cross section A of the stacked devices after the selective removal of the fourth sacrificial layer, in accordance with the embodiment of the present invention.

FIG. 4A illustrates cross section A of the stacked devices 100 after the selective removal of the fourth sacrificial layer 116, in accordance with the embodiment of the present invention. FIG. 4B illustrates cross section B of the stacked devices 100 after the selective removal of the fourth sacrificial layer 116, in accordance with the embodiment of the present invention. The fourth sacrificial layer 116 is selectively removed. The fourth sacrificial layer 116 can be targeted for selective removal while the other sacrificial layers are not removed because of the high Ge % contained within the fourth sacrificial layer 116.

Figure 5A:
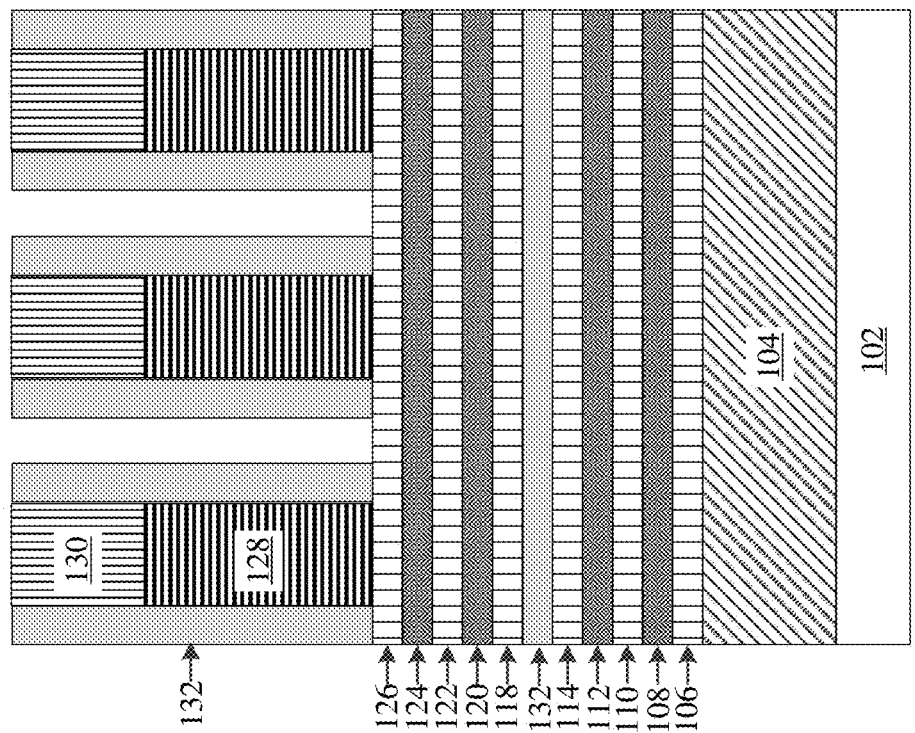
FIG. 5A illustrates cross section A of the stacked devices after the formation of a first spacer, in accordance with the embodiment of the present invention.
Figure 5B:
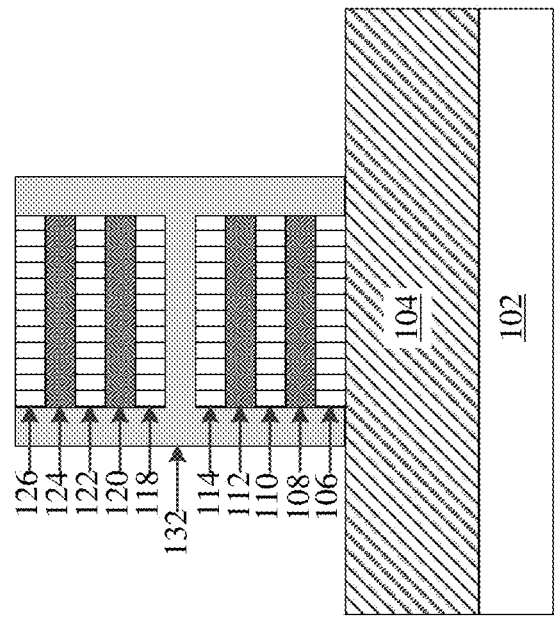
FIG. 5B illustrates cross section B of the stacked devices after the formation of the first spacer, in accordance with the embodiment of the present invention.

FIG. 5A illustrates cross section A of the stacked devices 100 after the formation of a first spacer 132, in accordance with the embodiment of the present invention. FIG. 5B illustrates cross section B of the stacked devices after the formation of the first spacer 132, in accordance with the embodiment of the present invention. A first spacer 132 is formed on the exposed surfaces of the different layers and in the space created by the removal of the fourth sacrificial layer 116, by a conformal dielectric deposition, e.g., ALD. The first spacer 132 is then anisotropically etched by, for example, reactive ion etching (RIE) to remove portions of the first spacer 132 that is over exposed horizontal surfaces. Thus, remaining portions of the first spacer 132 are located adjacent to the dummy gate 128, the hard mask 1230 as illustrated by FIG. 5A. FIG. 5B illustrates that another remaining portion of the first spacer 132 being located along the sides of the nanosheet stack 105.

FIG. 6A illustrates cross section A of the stacked devices 100 after formation of a lithography layer 134, in accordance with the embodiment of the present invention. FIG. 6B illustrates cross section B of the stacked devices 100 after formation of a cavity 136 in the dielectric layer 104, in accordance with the embodiment of the present invention. A lithography layer 134 is formed on the exposed surfaces and is patterned to allow the formation of a cavity 136. The lithography layer 134 can be for example, an optical planarization layer (OPL), but any suitable lithography material can be used. As illustrated by FIG. 6B, the lithography layer 134 is patterned to allow the creation of the cavity 136. The dielectric layer 104 is etched to create a cavity 136 the corresponds to the pattern in the lithography layer 134. The etch process is selective to surrounding materials, e.g., the first spacer 132 is not being etched. The cavity 136 allows for creation of the undercut of the lower S/D epi, wherein the undercut increases the contact surface area between the lower S/D epi and the electrical contact. Additionally, the lateral width of the cavity 136 can be increased by utilizing a lateral etching process (not shown). Increasing the lateral width of the cavity 136 will increase the undercut of the lower S/D epi during downstream processing. The cavity 136 will be filled with a sacrificial material (as described below) so that a portion of lower S/D epi can be formed on top of the sacrificial material that filled the cavity 136. The size of the cavity 136 determines amount of sacrificial material used to fill it, thus the determines the amount of available space on top of the sacrificial material available for formation of the lower S/D epi. The undercut is created when the sacrificial layer is removed and the bottom of the S/D epi that was formed on the sacrificial layer is exposed to the cavity 136. During downstream processing, the cavity 136 will be filled with material to form the electrical contact, thus allowing the electrical contact to be in direct contact with the bottom portion of the lower S/D epi that was exposed by the removal of the sacrificial layer. So the size of cavity 136 directly affects the surface contact area between the electrical contact and the bottom of the S/D epi.

Figure 7B:
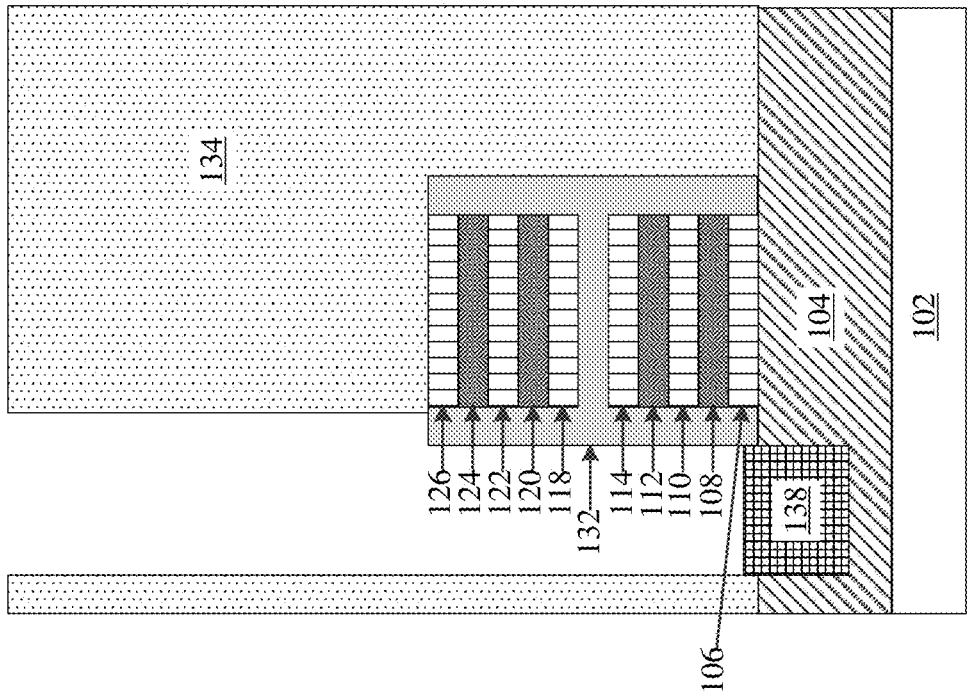
FIG. 7B illustrates cross section B of the stacked devices after filling the cavity with the eighth sacrificial layer, in accordance with the embodiment of the present invention.
Figure 7A:
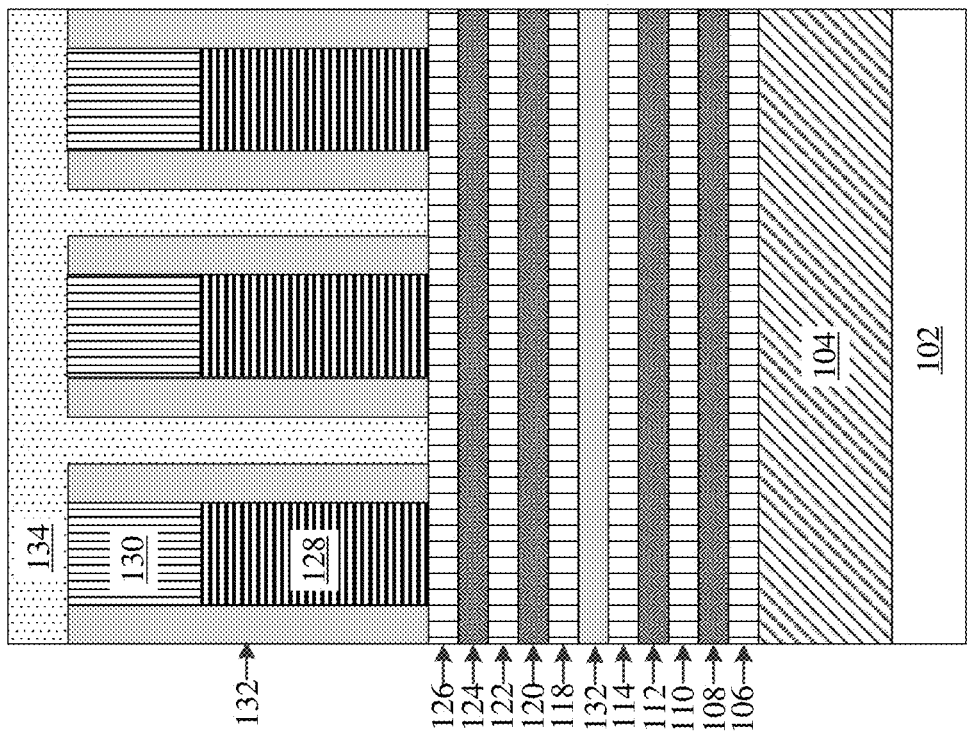
FIG. 7A illustrates cross section A of the stacked devices after filling the cavity with an eighth sacrificial layer, in accordance with the embodiment of the present invention.

FIG. 7A illustrates cross section A of the stacked devices 100 after filling the cavity 136 with an eighth sacrificial layer 138, in accordance with the embodiment of the present invention. FIG. 7B illustrates cross section B of the stacked devices 100 after filling the cavity 136 with the eighth sacrificial layer 138, in accordance with the embodiment of the present invention. An eighth sacrificial layer 138 is formed in the cavity 136 by, for example, atomic layer deposition (ALD) to pinch-off the cavity followed by etching it back. The eighth sacrificial layer 138 can be, for example, $TiO_x$.

Figure 8B:
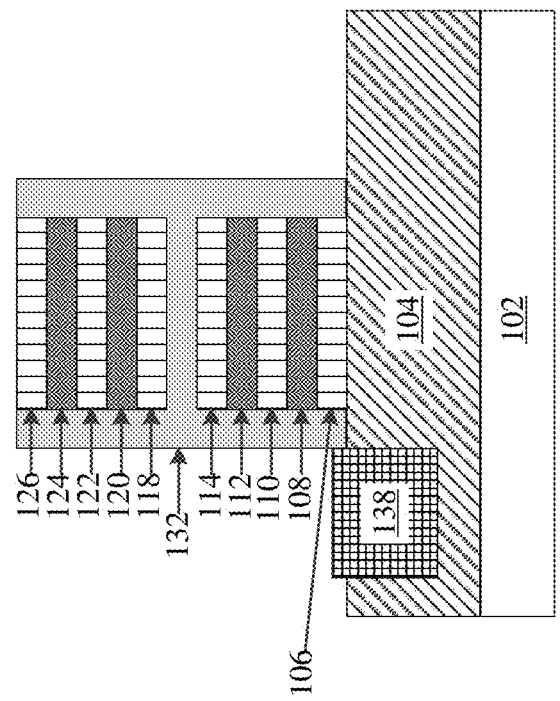
FIG. 8B illustrates cross section B of the stacked devices after removal of the lithography layer, in accordance with the embodiment of the present invention.
Figure 8A:
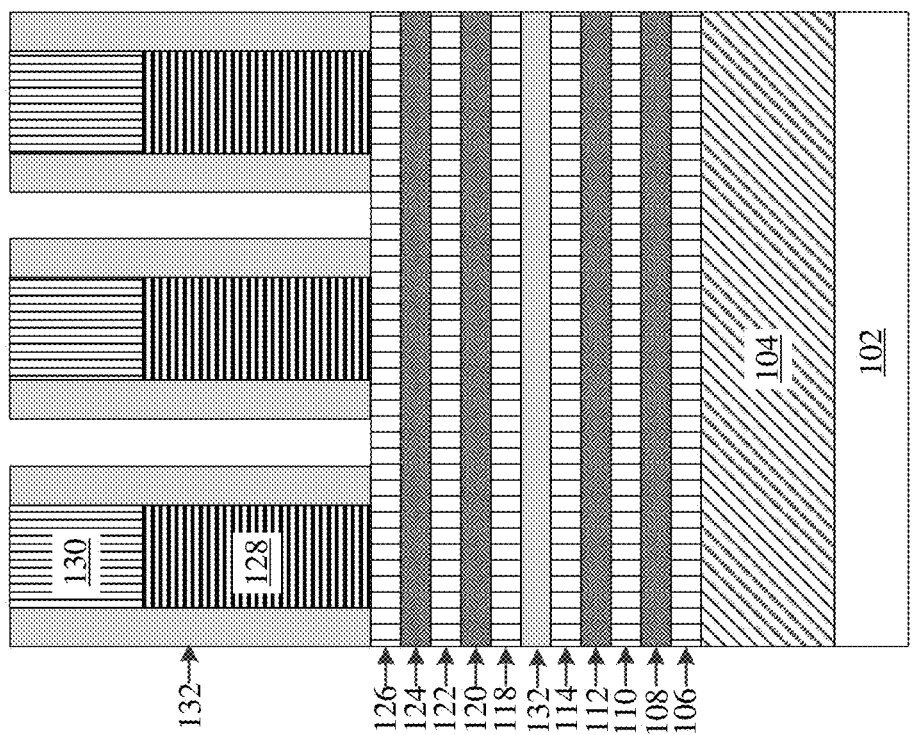
FIG. 8A illustrates cross section A of the stacked devices after removal of the lithography layer, in accordance with the embodiment of the present invention.

FIG. 8A illustrates cross section A of the stacked devices 100 after removal of the lithography layer, in accordance with the embodiment of the present invention. FIG. 8B illustrates cross section B of the stacked devices 100 after removal of the lithography layer, in accordance with the embodiment of the present invention. The lithography layer 134 is removed to expose the underlying nanosheet stack 105 and the first spacer 132. The lithography layer 1134 can be removed using a process such as oxygen ash or $N_2/H_2$ ash.

FIG. 9A illustrates cross section A of the stacked devices 100 after formation of a ninth sacrificial layer 140, in accordance with the embodiment of the present invention. FIG. 9B illustrates cross section B of the stacked devices 100 after formation of the ninth sacrificial layer 140, in accordance with the embodiment of the present invention. The ninth sacrificial layer 140 is filled over the remaining spaces of the structure, followed by recessing it to expose top portion of the first spacer 132. After that, the exposed first spacer 132 is removed to expose a portion of the hard mask 130. The ninth sacrificial layer 140 can be for example, an optical planarization layer, but any suitable lithography material can be used.

FIG. 10A illustrates cross section A of the stacked devices 100 after formation of a spacer cap 142, in accordance with the embodiment of the present invention. FIG. 10B illustrates cross section B of the stacked devices 100 after formation of the spacer cap 142, in accordance with the embodiment of the present invention. A spacer cap 142 is formed on top of portion of the exposed first spacer 132. As illustrated by FIG. 10B, the first spacer 132 is enclosed by the ninth sacrificial layer 140, so the spacer cap 142 is formed on top of the first spacer 132 that is located adjacent to the dummy gate 128 and the hard mask 130. The spacer cap 142 protects the first spacer 132 located beneath the spacer cap 142 from the downstream fabrication steps.

FIG. 11A illustrates cross section A of the stacked devices 100 after removing the ninth sacrificial layer 140, in accordance with the embodiment of the present invention. FIG. 11B illustrates cross section B of the stacked devices 100 after removing the ninth sacrificial layer 140, in accordance with the embodiment of the present invention. The ninth sacrificial layer 140 is removed to expose the first spacer 132 located on the sides of the nanosheet stack 105 in the source/drain epi region as illustrated by FIG. 11B.

Figure 12B:
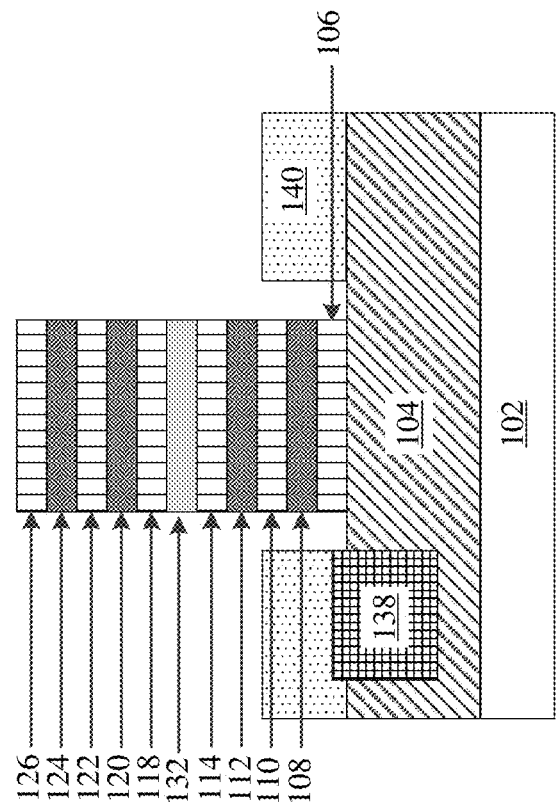
FIG. 12B illustrates cross section B of the stacked devices after etching the first spacer, in accordance with the embodiment of the present invention.
Figure 12A:
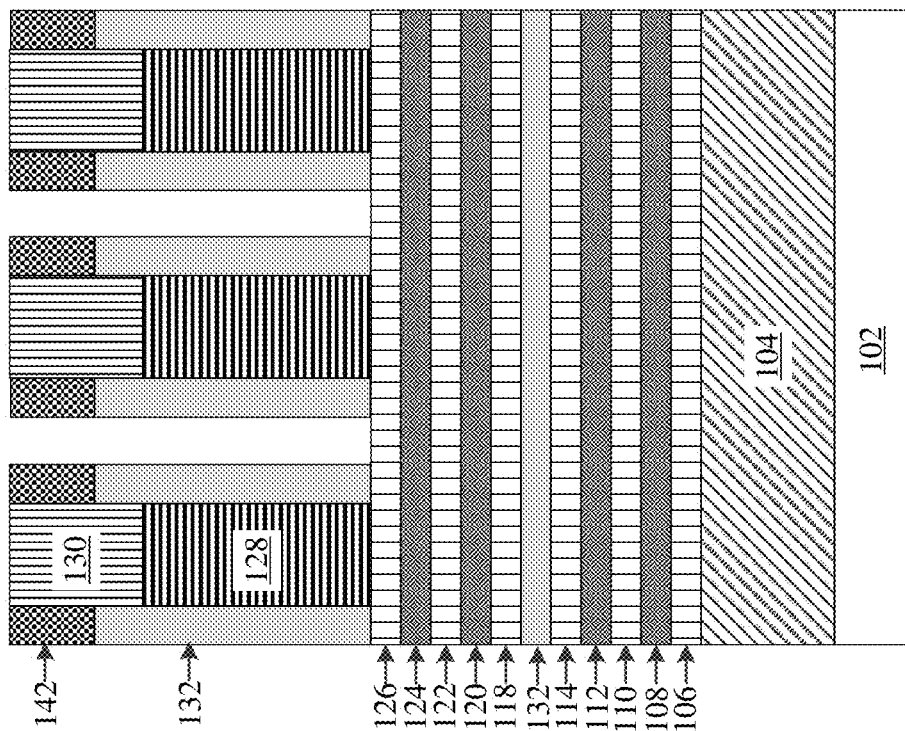
FIG. 12A illustrates cross section A of the stacked devices after etching the first spacer, in accordance with the embodiment of the present invention.

FIG. 12A illustrates cross section A of the stacked devices 100 after etching down the first spacer 132 in the source/drain region, in accordance with the embodiment of the present invention. FIG. 12B illustrates cross section B of the stacked devices 100 after etching down the first spacer 132 in the source/drain region, in accordance with the embodiment of the present invention. The first spacer 132 is anisotropically etched to expose the sides of the nanosheet stack 105 as illustrated by FIG. 12B. The removal of the first spacer 132 exposes the underlying oxide layer 104. The spacer cap 142 prevents the etching of the portion of the first spacer 132 that is adjacent to the dummy gate 128.

FIG. 13A illustrates cross section A of the stacked devices 100 after etching nanosheet stack 105, in accordance with the embodiment of the present invention. FIG. 13B illustrates cross section B of the stacked devices after etching the nanosheet stack 105, in accordance with the embodiment of the present invention. The nanosheet stack 105 is etched to make individual pillars as illustrated by FIG. 13A. FIG. 13B illustrates that the nanosheet stack is no longer present in cross section B. The dashed boxes indicate where the first layer 108, the second layer 112, the third layer 120, and fourth layer 124 were located.

FIG. 14A illustrates cross section A of the stacked devices 100 after formation of the inner spacer 144, in accordance with the embodiment of the present invention. FIG. 14B illustrates cross section B of the stacked devices 100 after formation of the inner spacer 144, in accordance with the embodiment of the present invention. The first sacrificial layer 106, the second sacrificial layer 110, the third sacrificial layer 114, the fifth sacrificial layer 118, the sixth sacrificial layer 122, and the seventh sacrificial layer 126 are recessed back to create space for the formation of the inner spacer 144. An inner spacer 144 is formed in the recessed areas of the sacrificial layers 106, 110, 114, 118, 122, 126. The inner spacer 144 can be formed by, for example, ALD to fill the space between the layers. The excess inner spacer 144 formed on the other exposed surfaces is removed by, for example, isotropic wet or day etch.

Figure 15A:
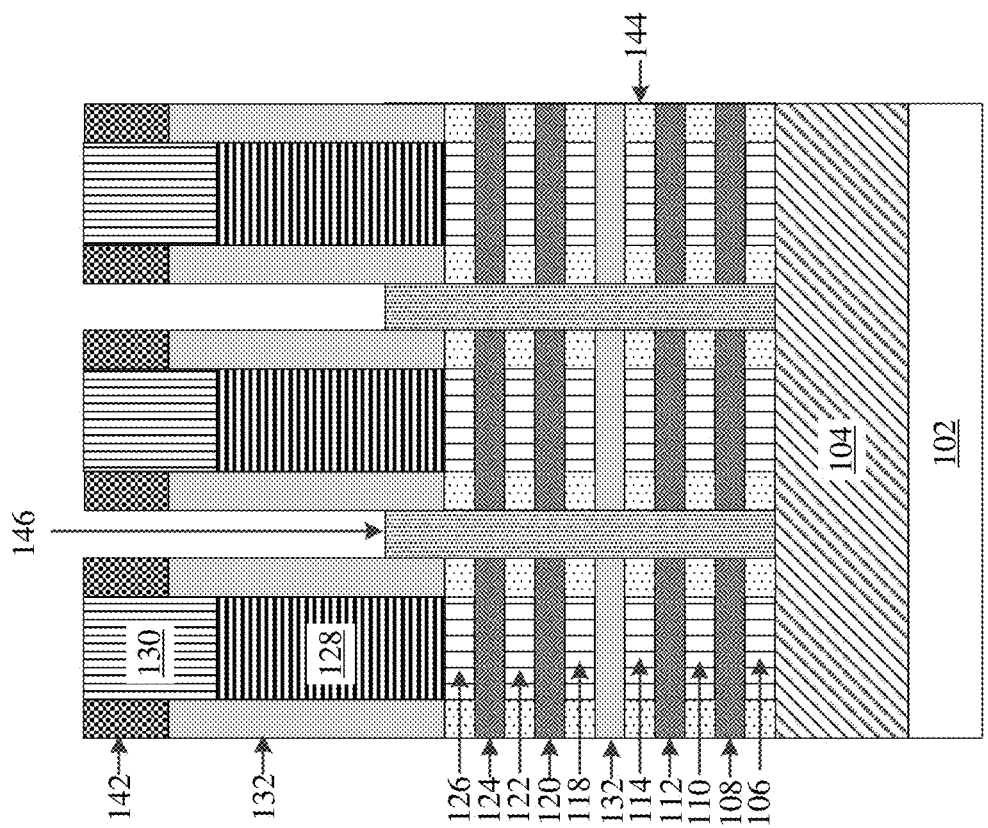
FIG. 15A illustrates cross section A of the stacked devices after formation of the lower device, in accordance with the embodiment of the present invention.
Figure 15B:
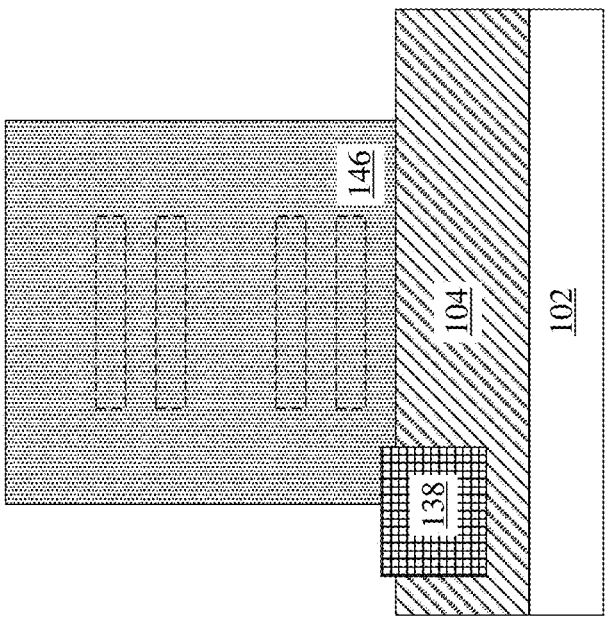
FIG. 15B illustrates cross section B of the stacked devices after formation of the lower device, in accordance with the embodiment of the present invention.

FIG. 15A illustrates cross section A of the stacked devices 100 after S/D epi formation of the lower device, in accordance with the embodiment of the present invention. FIG. 15B illustrates cross section B of the stacked nanosheet devices 100 after formation of the lower device, in accordance with the embodiment of the present invention. A portion of the lower S/D epi 146 is formed by epitaxy growth from the exposed sidewall surfaces of channel sheets, on the exposed surface of the dielectric layer 104 and a portion of the lower S/D epi 146 is formed on top of the eighth sacrificial layer 138. The portion of the lower S/D epi 146 that is formed directly on top of the eighth sacrificial layer 138 will be the portion of the lower S/D epi 146 to be connected to the electrical contact as described below. The portion of the lower S/D epi 146 is grown only on part of the eighth sacrificial layer 138. A portion of the eighth sacrificial layer 138 remains exposed, meaning that the lower S/D epi 146 is not grown on this portion of the eighth sacrificial layer 138. The exposed portion of the eighth sacrificial layer 138 is necessary for the downstream removal of the eighth sacrificial layer 138. In one embodiment, lower S/D epi 146 is formed by in-situ epitaxy, meaning dopants are incorporated to the source/drain during the epitaxy process. The lower S/D epi 146 can be for example, a n-type epi, or a p-type epi. For n-type epi, an n-type dopant selected from a group of phosphorus (P), arsenic (As) and/or antimony (Sb) can be used. For p-type epi, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figures 16A, 16B:
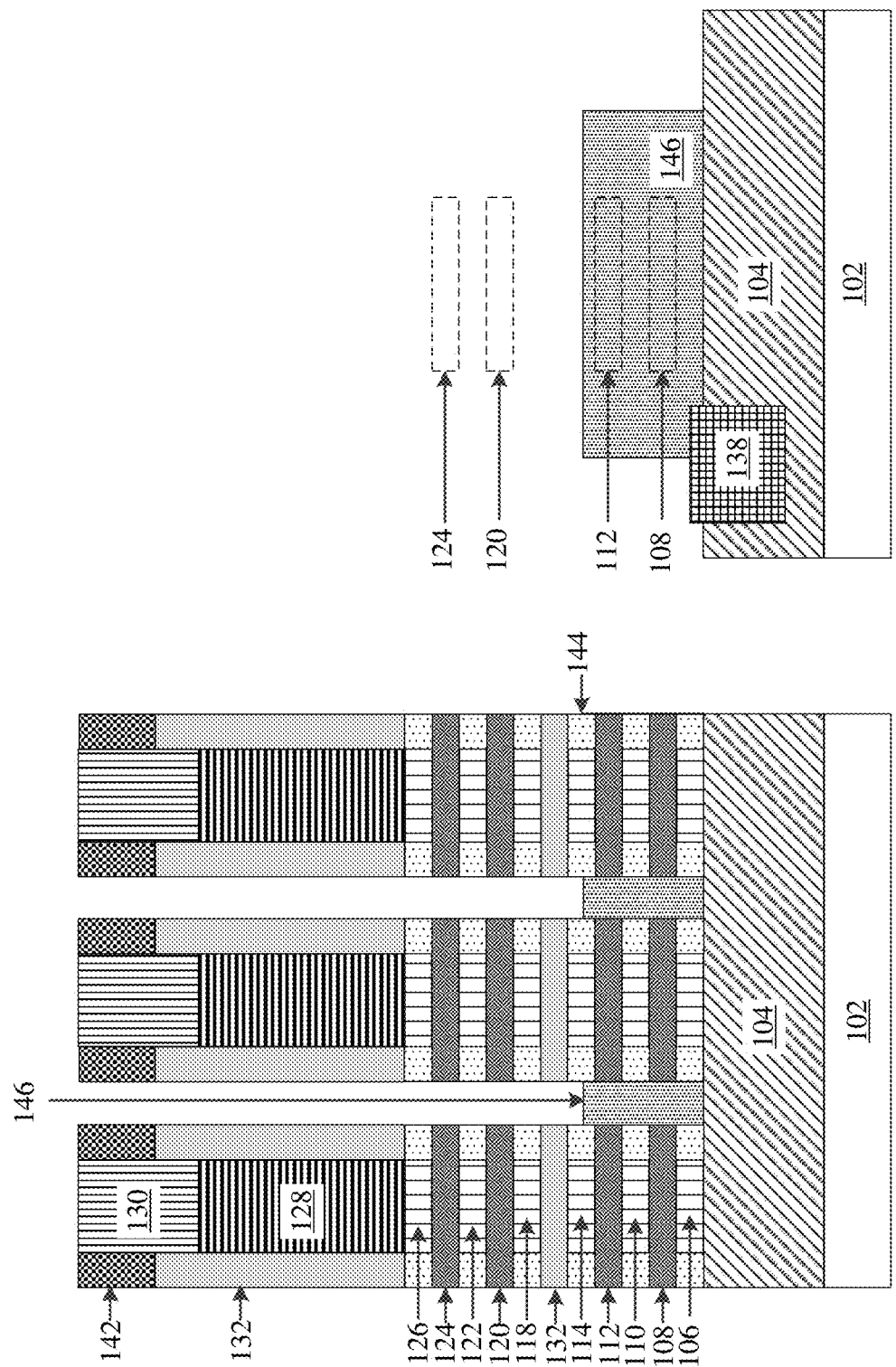
FIG. 16A illustrates cross section A of the stacked devices after recessing of the lower device, in accordance with the embodiment of the present invention.
FIG. 16B illustrates cross section B of the stacked devices after recessing of the lower device, in accordance with the embodiment of the present invention.

FIG. 16A illustrates cross section A of the stacked devices 100 after recessing of the lower S/D epi 146, in accordance with the embodiment of the present invention. FIG. 16B illustrates cross section B of the stacked devices 100 after recessing of the lower S/D epi 146, in accordance with the embodiment of the present invention. The lower S/D epi 146 is recessed such that the height of the lower S/D epi 146 is lower than the first spacer 132 located between the third sacrificial layer 114 and the fifth sacrificial layer 118.

Figure 17A:
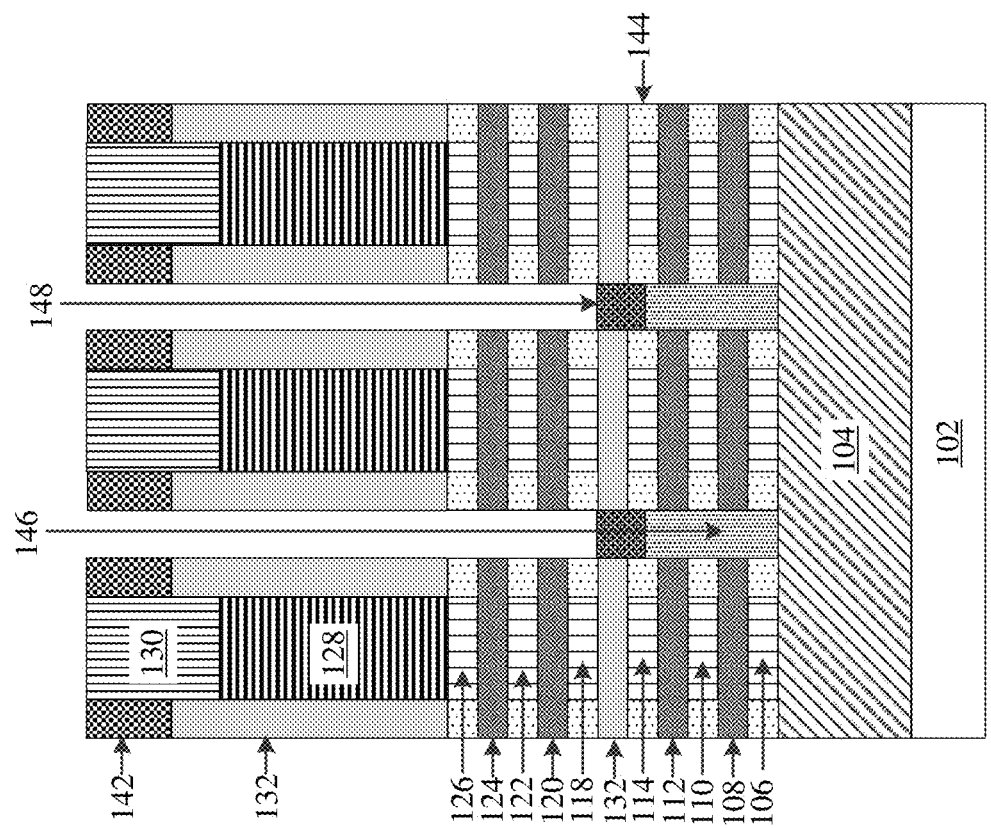
FIG. 17A illustrates cross section A of the stacked devices after formation of an isolation dielectric, in accordance with the embodiment of the present invention.
Figure 17B:
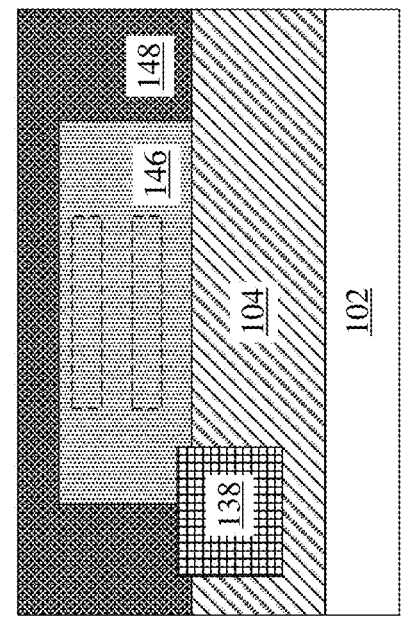
FIG. 17B illustrates cross section B of the stacked devices after formation of an isolation dielectric, in accordance with the embodiment of the present invention.

FIG. 17A illustrates cross section A of the stacked devices 100 after formation of an isolation dielectric 148, in accordance with the embodiment of the present invention. FIG. 17B illustrates cross section B of the stacked devices after formation of an isolation dielectric 148, in accordance with the embodiment of the present invention. An isolation dielectric 148 is formed on top and on the sides of the lower S/D epi 146 as illustrated by FIG. 17B. The isolation dielectric 148 is formed by either directional dielectric deposition or overfilling all the remaining space with dielectric followed by planarization and recess. The height of the isolation dielectric 148 should not reach to the height of bottom most channel layer of the top device.

Figure 18B:
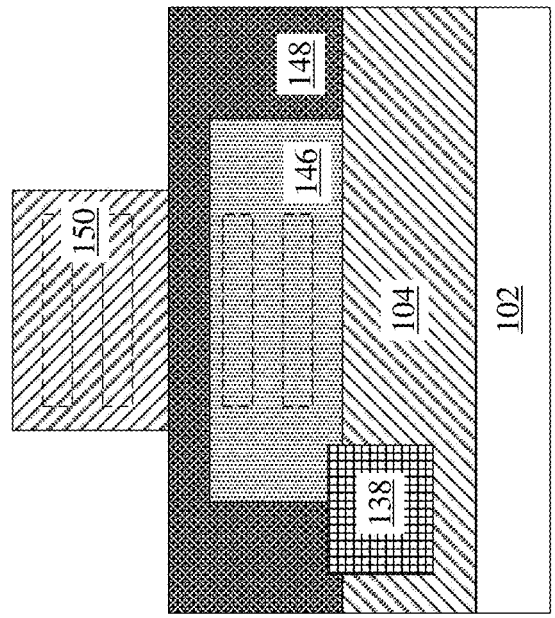
FIG. 18B illustrates cross section B of the stacked devices after formation of the upper device, in accordance with the embodiment of the present invention.
Figure 18A:
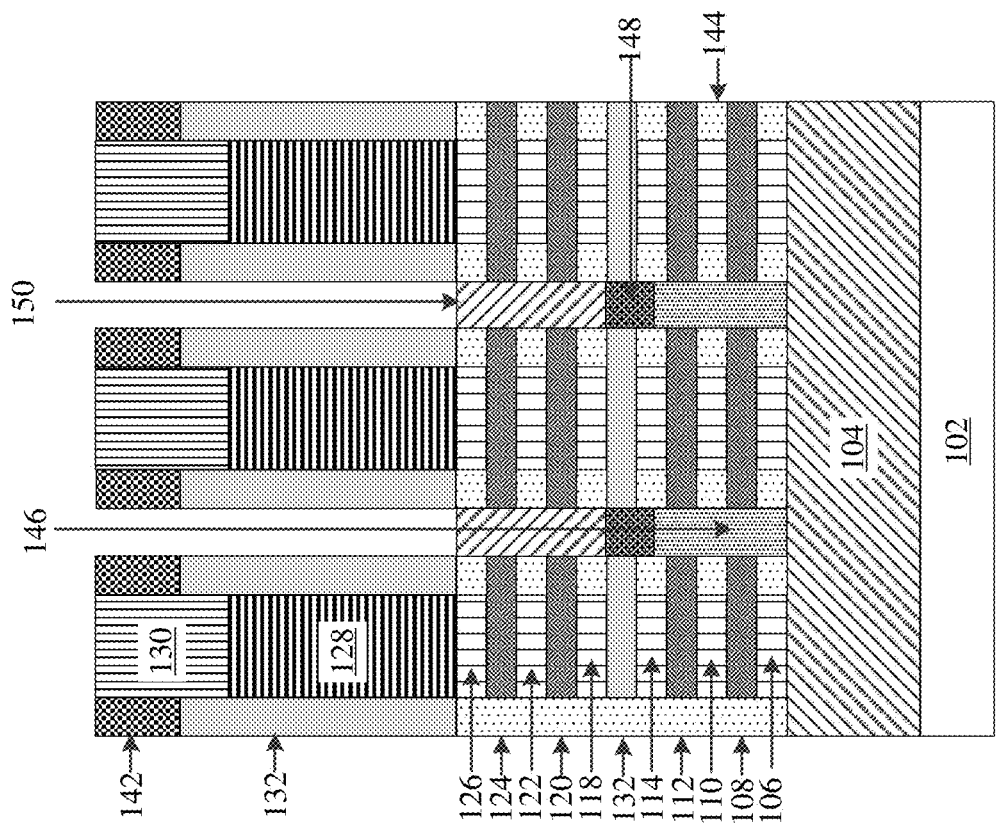
FIG. 18A illustrates cross section A of the stacked devices after formation of the upper device, in accordance with the embodiment of the present invention.

FIG. 18A illustrates cross section A of the stacked devices after formation of the S/D epi for the upper device, in accordance with the embodiment of the present invention. FIG. 18B illustrates cross section B of the stacked devices after formation of the S/D epi for the upper device, in accordance with the embodiment of the present invention. The upper S/D epi 150 is formed by epitaxy growth from exposed sidewall surfaces of channel sheets for top devices, on the exposed surface of the isolation dielectric 148. In one embodiment, upper S/D epi 150 is formed by in-situ epitaxy, meaning dopants are incorporated to the source/drain during the epitaxy process. The upper S/D epi 150 can be for example, an-type epi, or ap-type epi. For n-type epi, an n-type dopant selected from a group of phosphorus (P), arsenic (As) and/or antimony (Sb) can be used. For p-type epi, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. The upper S/D epi 150 tends to be narrower than the lower S/D epi 146 by controlling the lateral epi growth with suitable growth time.

FIG. 19A illustrates cross section A of the stacked devices 100 after formation of an interlayer dielectric layer 152, in accordance with the embodiment of the present invention. FIG. 19B illustrates cross section B of the stacked devices 100 after formation of the interlayer dielectric layer 152, in accordance with the embodiment of the present invention. An interlayered dielectric (ILD) layer 152 is formed on top of the isolation dielectric 148 and on top of the upper S/D epi 150. The ILD layer 152 is formed on three sides of the upper S/D epi 150 as illustrated by FIG. 19B. The spacer cap 142 and the hard mask 130 are planarized to expose the top surface of the dummy gate 128 by CMP process.

Figure 20B:
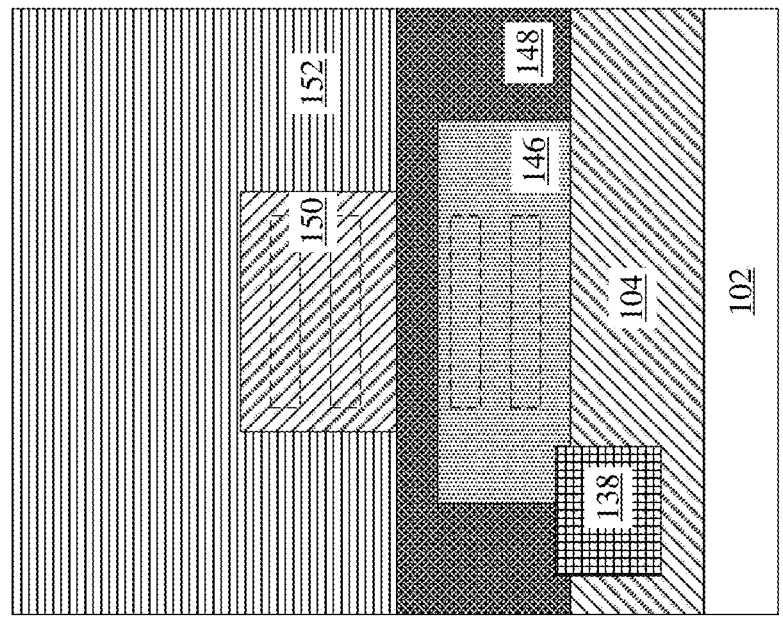
FIG. 20B illustrates cross section B of the stacked devices after formation of the gate, in accordance with the embodiment of the present invention.
Figure 20A:
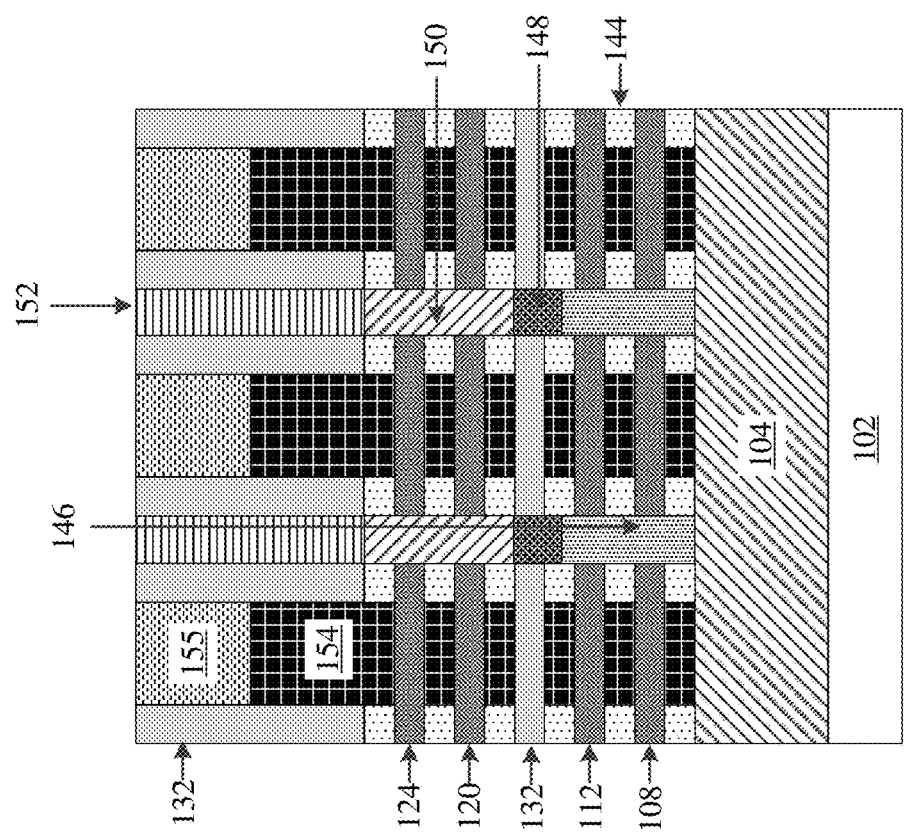
FIG. 20A illustrates cross section A of the stacked devices after formation of a gate, in accordance with the embodiment of the present invention.

FIG. 20A illustrates cross section A of the stacked devices 100 after formation of a gate 154, in accordance with the embodiment of the present invention. FIG. 20B illustrates cross section B of the stacked devices 100 after formation of the gate 154, in accordance with the embodiment of the present invention. The dummy gate 128 and SiGe sacrificial layers are removed. A gate 154 is formed by substituting a gate metal for the dummy gate 128, first sacrificial layer 106, the second sacrificial layer 110, the third sacrificial layer 114, the fifth sacrificial layer 118, the sixth sacrificial layer 122, and the seventh sacrificial layer 126 The gate 154 can be comprised of, for example, a high-k metal gate, or another conductive metal that can act as a gate. After gate 154 is formed, optionally, the gate 154 can be recessed, and a gate dielectric cap 155 can be formed over the gate to protect the gate from being short with S/D contacts.

Figure 21B:
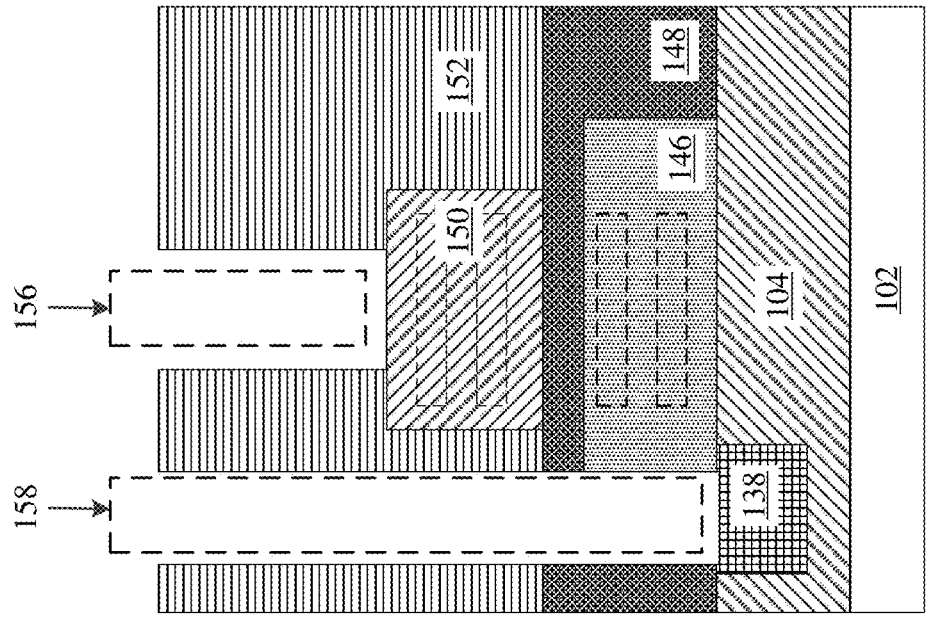
FIG. 21B illustrates cross section B of the stacked devices after formation of the contact openings, in accordance with the embodiment of the present invention.
Figure 21A:
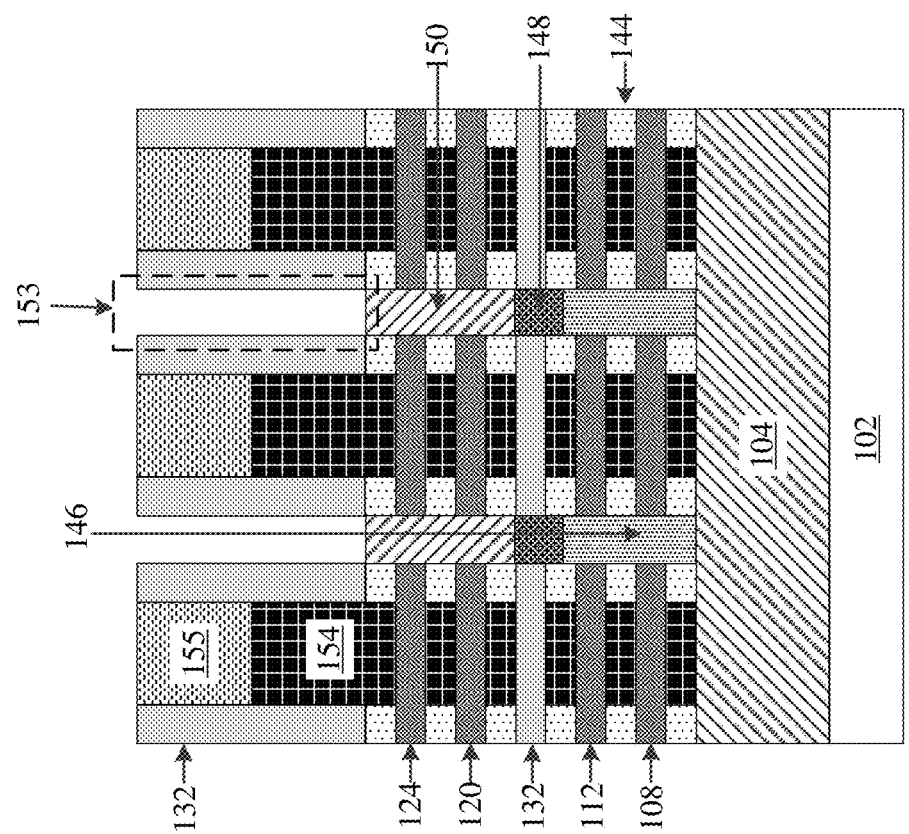
FIG. 21A illustrates cross section A of the stacked devices after formation of contact openings, in accordance with the embodiment of the present invention.

FIG. 21A illustrates cross section A of the stacked devices 100 after formation of contact openings, in accordance with the embodiment of the present invention. FIG. 21B illustrates cross section B of the stacked devices 100 after formation of the contact openings, in accordance with the embodiment of the present invention. The ILD layer 152 and the isolation dielectric 148 are etched to create the contact openings. FIG. 21A illustrates one of the contact openings 153 that is located on top of the upper S/D epi 150. FIG. 21B illustrates a different perspective of the contact opening 156 for the upper S/D epi 150 and contact opening 158 for the lower S/D epi 146. The upper contact opening 156 extends down through the ILD layer 152 to the top of the upper S/D epi 150. A portion of the top surface of the upper S/D epi 150 is exposed by the creation of the contact opening 156. A lower contact opening 158 extends downward through the ILD layer 152 and the isolation dielectric 148 to expose a portion of the top surface of the eighth sacrificial layer 138. The portion of the eighth sacrificial layer 138 that is exposed is the portion that does not have the lower S/D epi 146 located on top of it. The lower contact opening 158 exposes a sidewall of the lower S/D epi 146 and a portion of the eighth sacrificial layer 138.

FIG. 22A illustrates cross section A of the stacked devices 100 after removal of the eighth sacrificial layer 138, in accordance with the embodiment of the present invention. FIG. 22B illustrates cross section B of the stacked devices 100 after removal of the eighth sacrificial layer 138, in accordance with the embodiment of the present invention. The eighth sacrificial layer 138 is removed to leave behind cavity 160. Cavity 160 has the same dimension as cavity 136, so when the eight sacrificial layer 138 is removed then the bottom surface of the lower S/D epi 146 that was grown on the eighth sacrificial layer 138 is exposed. The cavity 160 extends under the lower S/D epi 146, such that the cavity 160 overlapped with the lower S/D epi 146. The portion of the lower S/D epi 146 that was formed on top of the eighth sacrificial layer 138 now over hangs a portion of the cavity 160. The exposed bottom surface of the lower S/D epi 146 is the part of the lower S/D epi that will be in direct contact with an electrical contact.

Figure 23B:
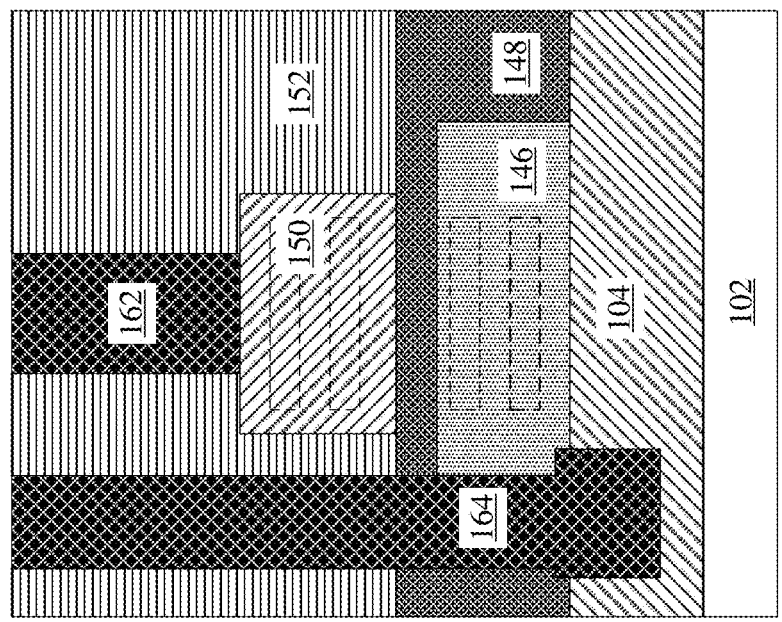
FIG. 23B illustrates cross section B of the stacked devices after formation of the electrical contacts, in accordance with the embodiment of the present invention.
Figure 23A:
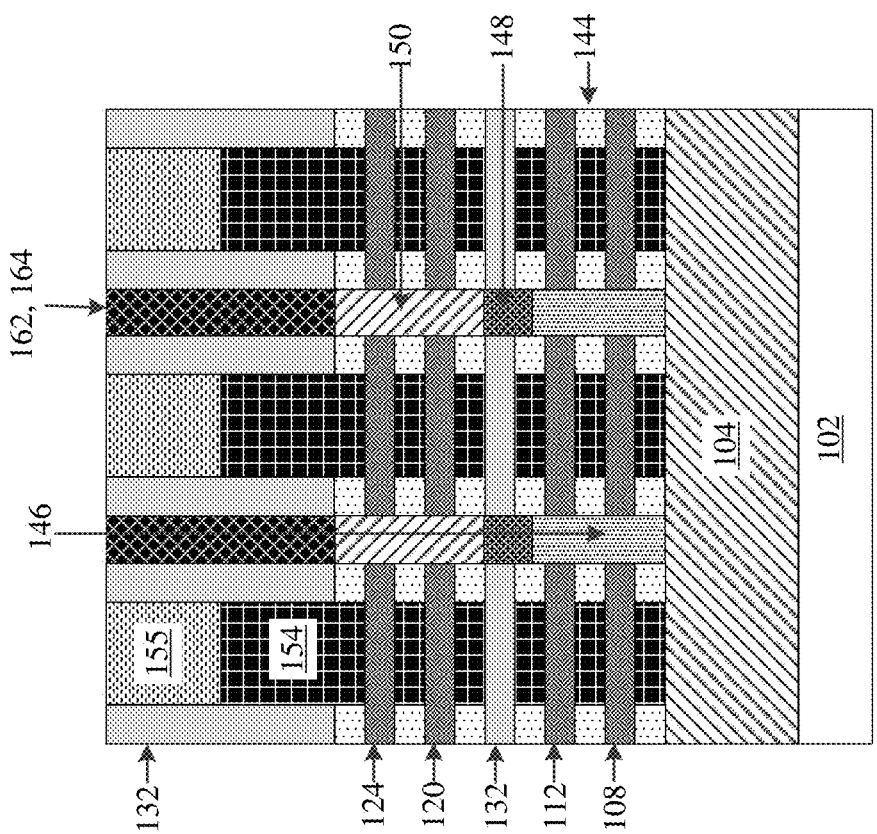
FIG. 23A illustrates cross section A of the stacked devices after formation of the electrical contacts, in accordance with the embodiment of the present invention.

FIG. 23A illustrates cross section A of the stacked devices 100 after formation of the electrical contacts, in accordance with the embodiment of the present invention. FIG. 23B illustrates cross section B of the stacked devices 100 after formation of the electrical contacts, in accordance with the embodiment of the present invention. A conductive metal is deposited to form the upper electrical contact 162 and the lower electrical contact 164. The upper electrical contact 164 is direct contact with the portion of the top surface of the upper S/D epi 150 that was exposed during the formation of the upper electrical contact opening 156. The lower electrical contact 164 is in direct contact with multiple sides of the lower S/D epi 146. The lower electrical contact 164 is in direct contact with the side of the lower S/D epi 146 that was exposed by lower contact opening 158. The lower electrical contact 164 further fills the cavity 160. The portion of the lower electrical contact 164 that fills the cavity is in direct contact with a portion bottom surface of the lower S/D epi 146. Therefore, the lower electrical contact 164 is in direct contact with two different sides of the lower S/D epi 146. The contact surface area between the lower electrical contact 164 and the lower S/D epi 146 is increased because the lower electrical contact 164 is in direct contact with two sides of the lower S/D epi 146. The contact surface area between the lower electrical contact 164 is the combined surface area of the sidewall of the lower S/D epi 146 and the portion of the bottom surface of the lower S/D epi 146 that overlapped with cavity 160. The surface area of the bottom surface of the lower S/D epi 146 that overlapped with cavity 160 can be smaller than, equal, or larger than the surface area of the sidewall of the lower S/D epi 146. The increased contact surface area is achieved without an increase in the footprint size of the stacked devices. The total contact surface area between the lower electrical contact 164 and the lower S/D epi 146 is the sum of a first contact area and a second contact surface area. The first contact surface area is comprised of the surface area of the sidewall of the lower S/D epi 146 that is in direct contact with a first portion of the lower electrical contact 146. The second contact surface area is comprised of the surface area of the bottom of the lower S/D epi that overlapped with cavity 160 that is in direct contact with a second portion of the lower electrical contact 164.

Figure 24B:
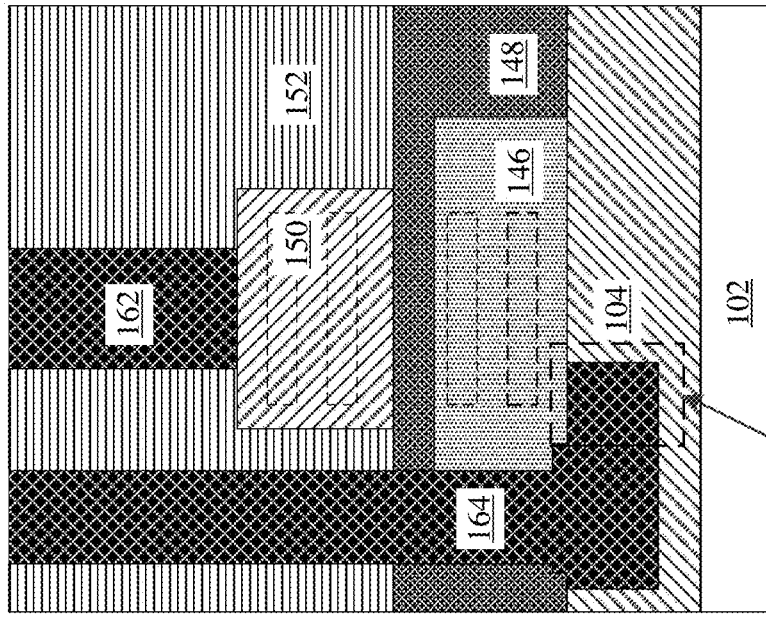
FIG. 24B illustrates cross section B of the stacked devices after formation of the electrical contacts, in accordance with the embodiment of the present invention.
Figure 24A:
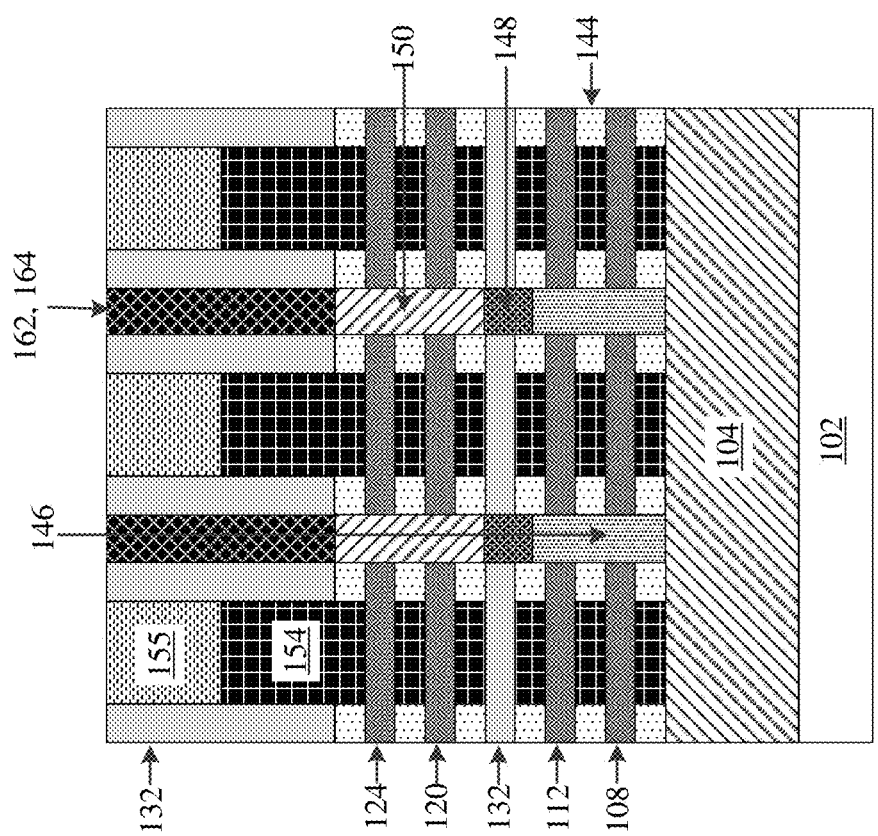
FIG. 24A illustrates cross section A of the stacked devices after formation of the electrical contacts, in accordance with the embodiment of the present invention.

FIG. 24A illustrates cross section A of the stacked devices 100 after formation of the electrical contacts, in accordance with the embodiment of the present invention. FIG. 24B illustrates cross section B of the stacked nanosheet devices 100 after formation of the electrical contacts, in accordance with the embodiment of the present invention. FIGS. 24A and 24B are similar to FIGS. 23A and 23B except for extended section 165. The lateral width of cavity 136 was extended using a lateral etching process as described above in reference to FIGS. 6A and 6B. The lateral extended section 165 causes the later increase of cavity 160. Therefore, when the enlarged cavity 160 is filled with conductive metal that comprises the lower electrical contact 164, the overlap between the lower S/D epi 146 and the lower electrical contact 164 is increased because cavity 136 was enlarged.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A stacked semiconductor device comprising:
   a lower source/drain epi located on top of a bottom dielectric layer;
   an isolation layer located on top of the lower source/drain epi;
   an upper source/drain epi located on top of the isolation layer; and
   a lower electrical contact that is connected to the lower source/drain epi, wherein the lower electrical contact is in direct contact with multiple side surfaces of the lower source/drain epi, wherein the lower electrical contact extends under the lower source/drain epi.

2. The stacked semiconductor device of claim 1, wherein the one of the multiple side surfaces of the lower source/drain epi that is in contact with the lower electrical contact is a vertical sidewall of the lower source/drain epi.

3. The stacked semiconductor device of claim 1, wherein the one of the multiple side surfaces of the lower source/drain epi that is in contact with the lower electrical contact is a portion of a bottom surface of the lower source/drain epi.

4. The stacked semiconductor device of claim 1, wherein a first portion of a bottom surface of the lower source/drain epi is in direct contact with a top surface of a dielectric layer, and wherein a second portion of the bottom surface of the lower source/drain epi is in direct contact with the lower electrical contact.

5. The stacked semiconductor device of claim 4, wherein the one of the multiple surfaces of the lower source/drain epi that is in contact with the lower electrical contact is a vertical sidewall of the lower source/drain epi.

6. The stacked semiconductor device of claim 5, wherein the lower electrical contact is in direct contact with multiple side surfaces of the lower source/drain epi is comprised of:
   a first contact surface area between the vertical sidewall of the lower source/drain epi connected to the lower electrical contact; and
   a second contact surface area between a second portion of the bottom surface of the lower source/drain epi that is connected to the lower electrical contact, wherein a total contact surface area between the lower source/drain epi and the upper source/drain epi is a sum of the first contact surface area and the second contact surface area.

7. The stacked semiconductor device of claim 6, wherein the first contact surface area is larger than the second contact surface area.

8. The stacked semiconductor device of claim 6, wherein the first contact surface area is smaller than the second contact surface area.

9. The stacked semiconductor device of claim 6, wherein the first contact surface area is about equal to the second contact surface area.

10. A stacked semiconductor device comprising:
    a lower source/drain epi located on top of a dielectric layer, wherein the lower source/drain epi is comprised of a n-type epi, or a p-type epi;
    an isolation layer located on top of the lower source/drain epi and the side of the lower source/drain epi;
    an upper source/drain epi located on top of the isolation layer, wherein the upper source/drain epi is comprised of a n-type epi, or a p-type epi;
    an interlayer dielectric formed around the upper source/drain epi;
    an upper electrical contact that extends through the interlayered dielectric to connect to the upper source/drain epi; and
    a lower electrical contact that extends through the interlayer dielectric and the isolation layer to be connected to the lower source/drain epi, wherein the lower electrical contact is in direct contact with multiple surfaces of the lower source/drain epi, wherein the lower electrical contact extends under the lower source/drain epi.

11. The stacked semiconductor device of claim 10, wherein a first portion of the bottom surface of the lower source/drain epi is in direct contact with the top surface of the dielectric layer, and wherein a second portion of the bottom surface of the lower source/drain epi is in direct contact with the lower electrical contact.

12. The stacked semiconductor device of claim 11, wherein the one of the multiple surfaces of the lower source/drain epi that is in contact with the lower electrical contact is a vertical sidewall of the lower source/drain epi.

13. The stacked semiconductor device of claim 12, wherein the lower electrical contact is in direct contact with multiple side surfaces of the lower source/drain epi is comprised of:
    a first contact surface area that is comprised of the vertical sidewall of the lower source/drain epi that is connected to the lower electrical contact; and
    a second contact surface area that is comprised of the second portion of the bottom surface of the lower source/drain epi that is connected to the lower electrical contact, wherein the total contact surface area between the lower source/drain epi and the upper source/drain epi is the sum of the first contact surface area and the second contact surface area.

14. The stacked semiconductor device of claim 13, wherein the first contact surface area is larger than the second contact surface area.

15. The stacked semiconductor device of claim 13, wherein the first contact surface area is smaller than the second contact surface area.

16. The stacked semiconductor device of claim 13, wherein the first contact surface area is about equal to the second contact surface area.

* * * * *